United States Patent
Todo et al.

(10) Patent No.: US 6,516,034 B2
(45) Date of Patent: *Feb. 4, 2003

(54) STREAM PROCESSING APPARATUS AND METHOD

(75) Inventors: Shin Todo, Kanagawa (JP); Haruo Togashi, Kanagawa (JP); Hideyuki Matsumoto, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,226

(22) Filed: Jul. 8, 1999

(65) Prior Publication Data

US 2002/0114397 A1 Aug. 22, 2002

(30) Foreign Application Priority Data

Jul. 9, 1998 (JP) .......................................... 10-194005

(51) Int. Cl.[7] ................................................. H04N 1/66
(52) U.S. Cl. ................................................. 375/240.25
(58) Field of Search ........................... 375/240, 240.01, 375/240.02, 240.1, 240.11, 240.12, 240.13, 240.14, 240.15, 240.25, 240.26; 348/384, 390, 410, 411, 413, 414, 426, 415; 382/232, 234, 236; H04B 1/66

(56) References Cited

U.S. PATENT DOCUMENTS

| | | | | |
|---|---|---|---|---|
| 5,440,345 A | * | 8/1995 | Shimoda | 348/411 |
| 5,442,400 A | * | 8/1995 | Sun et al. | 348/402.1 |
| 5,686,965 A | * | 11/1997 | Auld | 348/423 |
| 5,852,469 A | * | 12/1998 | Nagai et al. | 348/384.1 |
| 6,058,122 A | * | 5/2000 | Hwang et al. | 370/522 |
| 6,094,234 A | * | 7/2000 | Nonomura et al. | 348/700 |
| 6,134,382 A | * | 10/2000 | Mishima et al. | 386/68 |
| 6,160,849 A | * | 12/2000 | Igarashi et al. | 375/240.14 |
| 6,308,296 B1 | * | 10/2001 | Sasaki | 714/763 |

\* cited by examiner

*Primary Examiner*—Chris Kelley
*Assistant Examiner*—Tung Vo
(74) *Attorney, Agent, or Firm*—Frommer Lawrence & Haug LLP; William S. Frommer; Dennis M. Smid

(57) ABSTRACT

A stream processing apparatus and method for replacing a macroblock having a syntax error in an encoded stream with a marcroblock having an acceptable syntax. In such apparatus and method, a plurality of coding parameters may be extracted from the source encoded stream, an error macroblock having a syntax error in the source encoded stream may be detected, the source encoded stream may be variable-length decoded so as to generate a variable-length-decoded stream, a predetermined macroblock having an acceptable syntax may be generated which conforms to a MPEG (motion picture image coding experts group) standard, and the error macroblock of the variable-length decoded stream may be replaced with the predetermined macroblock.

20 Claims, 22 Drawing Sheets

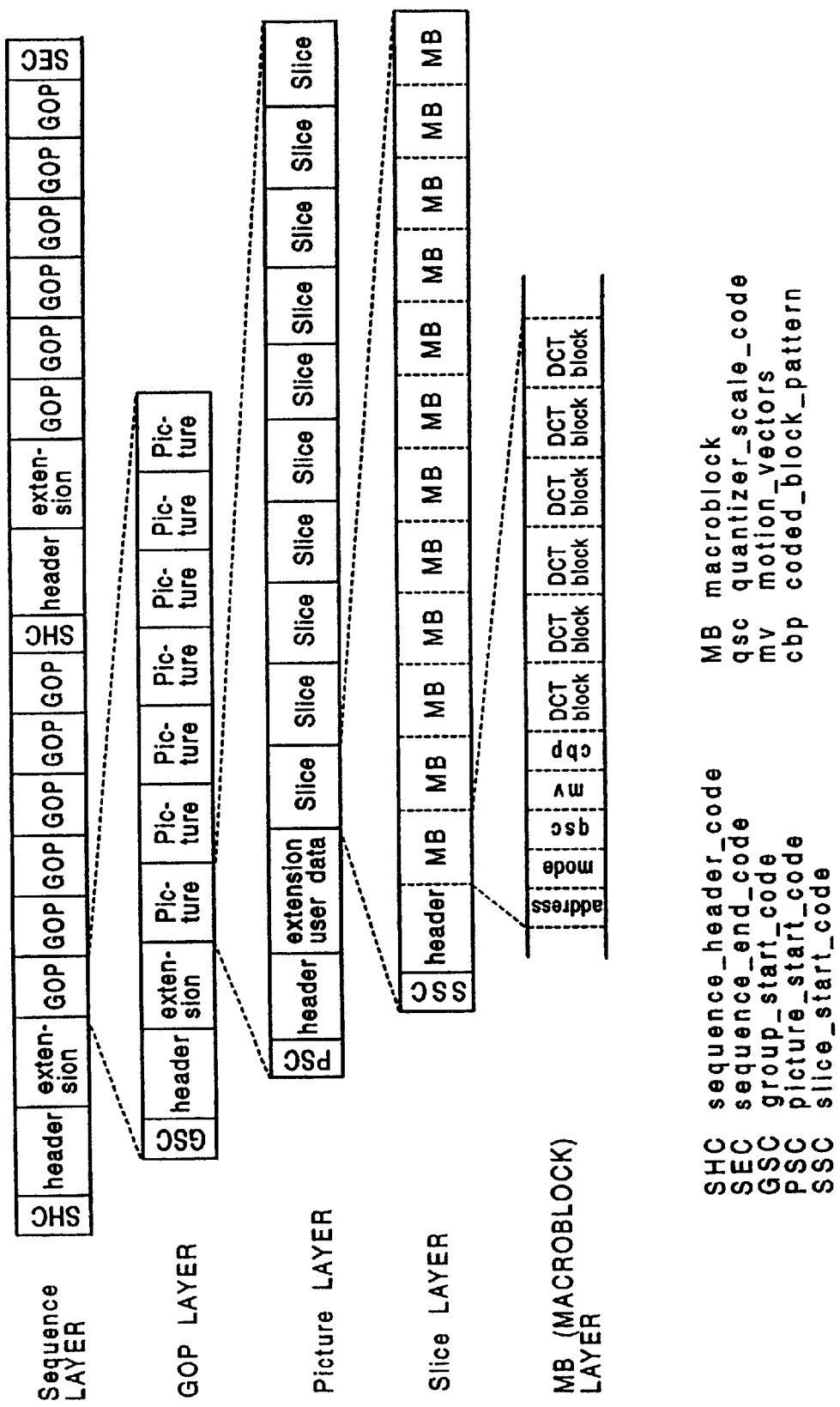

macroblock_address_increment  (2) (2) (1) (1) (3) (1)

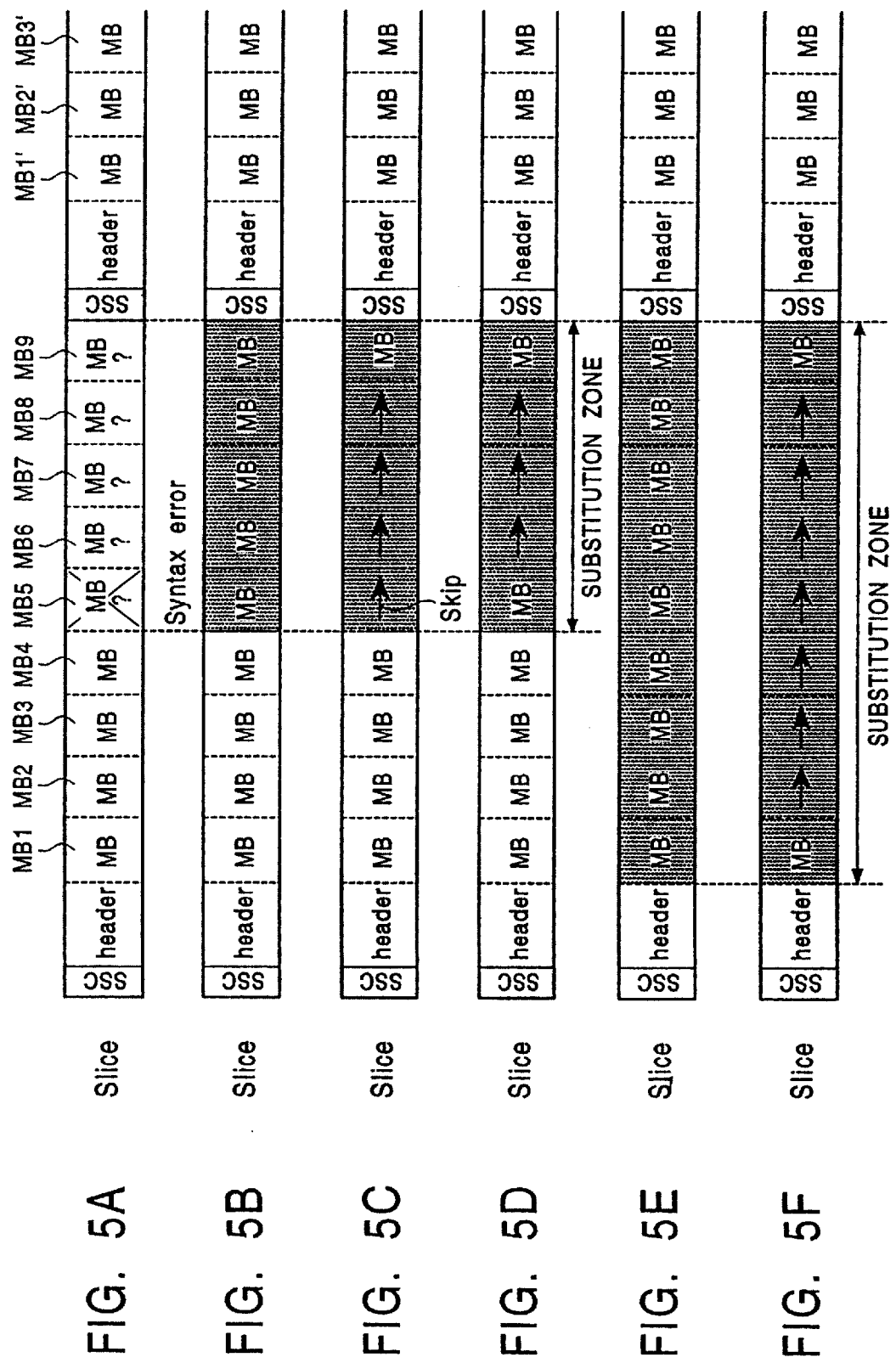

Picture LAYER
Syntax error

FIG. 8A
FIG. 8B

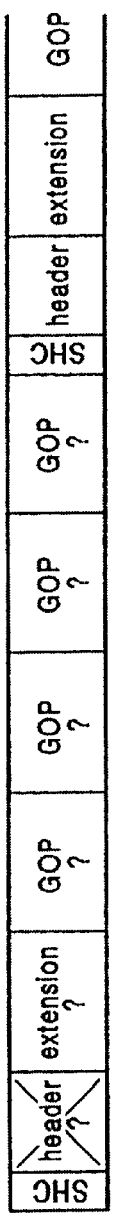
FIG. 9A   FIG. 9B   FIG. 9C

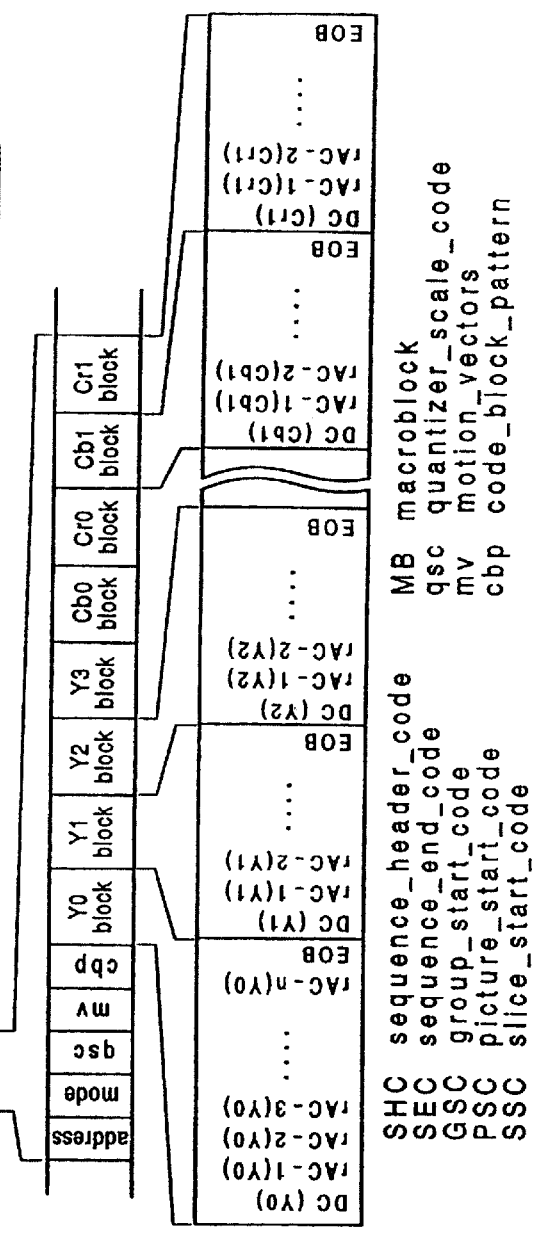
FIG. 12A SEQUENCE LAYER
FIG. 12B GOP LAYER
FIG. 12C PICTURE LAYER
FIG. 12D SLICE LAYER
FIG. 12E MB (MACROBLOCK) LAYER
FIG. 12F ENCODED DATA

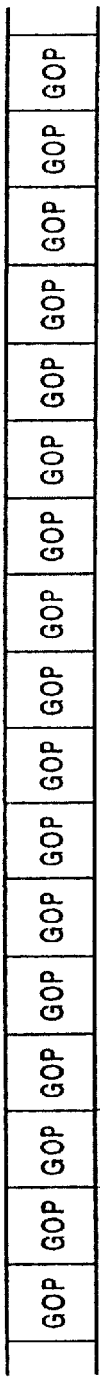
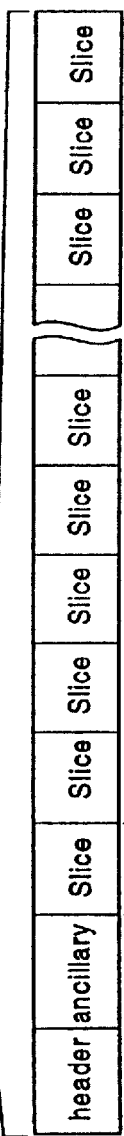
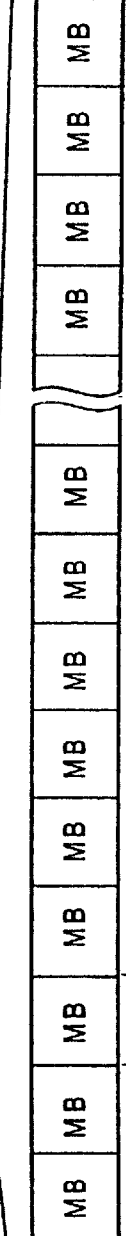
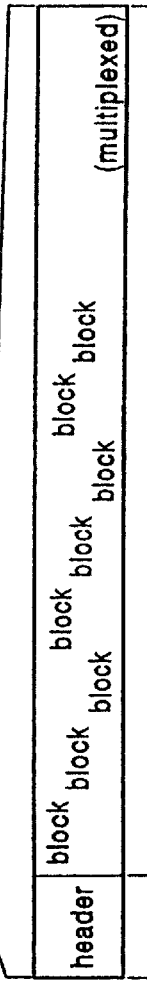
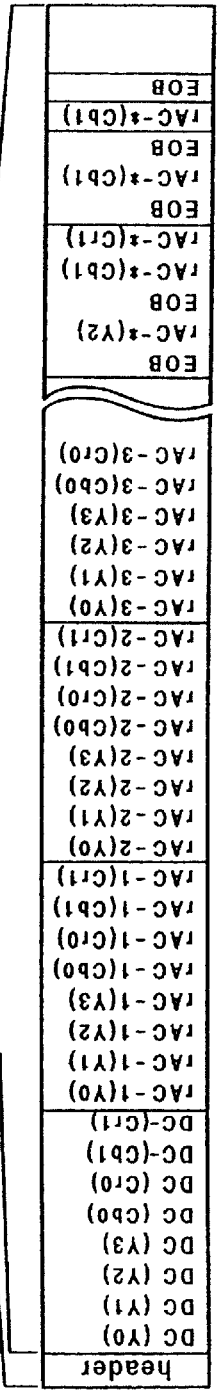
FIG. 13A SEQUENCE LAYER
FIG. 13B GOP LAYER
FIG. 13C PICTURE LAYER
FIG. 13D SLICE LAYER
FIG. 13E MB (MACROBLOCK) LAYER
FIG. 13F ENCODED DATA

FIG. 20

| | | | | | | | | |
|---|---|---|---|---|---|---|---|---|
| bit16 | 0 | 0 | M | M | M | M | M | M |
| bit15 | 0 | 0 | U | U | U | U | U | U |
| bit14 | 0 | 0 | U | U | U | U | U | U |
| bit13 | 0 | 0 | U | U | U | U | U | U |
| bit12 | 0 | 0 | U | U | U | U | U | U |
| bit11 | 0 | 0 | U | U | U | U | U | U |
| bit10 | 0 | 0 | U | U | U | U | U | U |
| bit9  | 0 | 1 | U | U | U | U | U | U |
| bit8  | 0 | 1 | U | U | U | U | U | U |
| bit7  | 0 | 0 | U | U | U | U | U | U |
| bit6  | 0 | 1 | U | U | U | U | U | U |
| bit5  | 0 | 1 | U | U | U | U | U | U |
| bit4  | 0 | 0 | U | U | U | U | U | U |
| bit3  | 0 | 0 | U | U | U | U | U | U |
| bit2  | 0 | 1 | U | U | U | U | U | U |
| bit1  | 0 | 0 | U | U | U | U | U | U |

USER DATA STATUS CODE

M : MARKER BITS
U : USER DATA AREA WHICH CAN BE ACTUALLY USED

BITS ENCLOSED BY ONE-DOT CHAIN LINE
ARE SELECTED BY SEL

STREAM PROCESSING APPARATUS AND METHOD

BACKGROUND OF THE INVENTION

The present invention relates to a stream processing technique, and more particularly, to such technique for correcting a syntax error in an source encoded stream by substituting a macroblock(s) having the syntax error and/or a macroblock(s) which will not be parsed or variable-length-decoded correctly due to the syntax error with a predetermined macroblock(s) having a correct or acceptable syntax.

Several types of formats for recording a digital video signal on a recording medium and transmitting are available. However, since a digital video signal may have a relatively large amount of data, the video signal may be compression encoded so as to enable data corresponding to a relatively long playback period to be recorded on a recording medium. An example of a compression encoding method is a so-called MPEG (Moving Picture Image Coding Experts Group) method which is a hybrid method wherein motion-compensation predictive coding and discrete cosine transform (DCT) coding are combined. In other words, redundancy in the time domain is reduced by taking a difference between frames of a video signal and redundancy in the spatial domain is reduced by the use of discrete cosine transform (DCT) to efficiently encode the video signal.

In a video tape recorder (VTR), which uses a tape-shaped recording medium such as a magnetic tape recording medium, a recording process may be performed in which tracks disposed at an angle to a tape running direction (so-called helical tracks) are formed with the use of a rotating head. When such tape-shaped recording medium having helical tracks is reproduced at a speed higher than a normal tape running speed such as two times the normal speed (double speed) or three times the normal speed (triple speed) or such as that in a search function, since the trace angle of the rotating head on the tape becomes different from the angle of the recording tracks, all of the signals recorded in the helical tracks may not be reproduced. In other words, during high speed reproduction, the video tape recorder may not reproduce all data elements recorded in the helical tracks, and instead may only reproduce some of such data elements.

An arrangement of data elements (such as DCT coefficients) of a MPEG stream generated by a MPEG encoding method may not be suitable for recording or reproducing on or from a tape recording medium and high-speed reproducing by the video tape recorder. In other words, if a MPEG stream recorded on a tape recording medium is reproduced at a high-speed, the reproduced video stream may not have all of the data elements and, as a result of such reproduction, it may be difficult to obtain a high-quality image with an effective use of the reproduced stream.

Therefore, it may be preferable to use an encoded stream format which allows image reproduction to be performed effectively even in high-speed reproduction, instead of the MPEG encoded stream as a compression encoding method for a tape-shaped recording medium. In consideration thereof, a so called "SX stream" or "Betacam-SX stream" has been proposed which is suitable for high-speed reproduction.

The SX stream is generated by a SX encoder which utilizes a hybrid encoding technique which includes motion-compensation predictive coding and discrete cosine transform coding similar to that of the MPEG encoding method. Accordingly, the SX stream generated by the SX encoding method follows the MPEG standard. However, the SX stream and the MPEG stream differ in the arrangement of DCT coefficients in the encoded stream. Specifically, with regard to the DCT coefficients, to create a high quality image during high-speed reproduction, the DC element and AC elements having lower spatial frequency may be considered more important than the AC elements having higher spatial frequency. As a result, in the SX stream, AC elements of the DCT coefficients in the macroblock are rearranged in spatial frequency order from lower spatial frequency to higher spatial frequency.

Thus, although the SX stream is compliant with the MPEG standard, the SX stream is not the same as a MPEG stream and is suitable for high speed reproduction with a VTR.

When an encoded stream is to be transmitted to a MPEG device, it may be preferred to use a MPEG stream as the transmitting stream. On the other hand, when an encoded stream is to be recorded onto a tape medium, it may be preferred to use a SX stream as the recording stream. In consideration thereof, a stream processing apparatus for processing a source encoded stream so as to convert a stream structure from that of a MPEG stream to that of a SX stream or from that of a SX stream to that of a MPEG stream has been proposed. Such stream processing apparatus is described in U.S. patent application Ser. No. 09/283,034 filed Apr. 1, 1999 which is hereby incorporated by reference. When stream processing is performed on a source encoded stream by using such stream processing apparatus, it may be necessary to parse the syntax of the source encoded stream to extract the coding parameters.

However, if a syntax error occurred in the source encoded stream, the syntax of the source encoded stream will not be able to be correctly parsed or variable-length-decoded.

Such syntax error may occur when prohibitive coding parameters, non-determined coding parameters, or contradiction coding parameters are included in the source encoded stream. Also, when the source encoded stream includes data elements not corresponding to the variable encoding table, data elements which are interrupted, or data elements not having a predetermined data length, a syntax error may occur. As a result of the failure of the parsing or the variable-length-decoding process due to a syntax error, the above stream processing apparatus may not operate properly.

Furthermore, since a MPEG stream comprises a variable-length encoded (VLC) code stream, if a syntax error occurs in one respective macroblock in a slice layer, a plurality of macroblocks after the respective macroblock may not be properly parsed or variable-length-decoded.

OBJECTS AND SUMMARY OF THE INVENTION

An object of the present invention is to provide a stream processing technique which may properly process a source encoded stream regardless of a syntax error in a source parsing operation.

Another object of the present invention is to provide a stream processing technique as aforesaid wherein a macroblock having a syntax error is replaced by a macroblock having an acceptable or correct syntax.

A further object of the present invention is to provide a stream processing technique as aforesaid wherein the macroblock having a syntax error and a number of macroblocks which follow and/or precede the macroblock having the syntax error are replaced with macroblocks having an acceptable or correct syntax.

In accordance with an aspect of the present invention, a stream processing apparatus is provided which comprises a parsing device for parsing a syntax of a source encoded stream to extract a plurality of coding parameters from the source encoded stream, a detecting device for detecting an error macroblock having a syntax error in the source encoded stream in accordance with a result of a parsing process performed by the parsing device; a variable-length-decoding device for performing a variable-length-decoding process on the source encoded stream to generate a variable-length-decoded stream; a generating device for generating a predetermined macroblock having a correct syntax which conforms to a motion picture image coding experts group (MPEG) standard; and a substituting device for substituting the predetermined macroblock from the generating device for the error macroblock of the variable-length-decoded stream. A corresponding method is also provided.

In accordance with another aspect of the present invention, a stream processing apparatus is provided which comprises a parsing device for parsing a syntax of a source encoded stream to extract a plurality of coding parameters from the source encoded stream a detecting device for detecting an error layer having a syntax error in the source encoded stream in accordance with a result of a parsing process performed by the parsing device, a variable-length-decoding device for performing a variable-length-decoding process on the source encoded stream to generate a variable-length-decoded stream, a generating device for generating a predetermined layer having a correct syntax which conforms to a motion picture image coding experts group (MPEG) standard, and a substituting device for substituting the predetermined layer from the generating device for the error layer of the variable-length-decoded stream. A corresponding method is also provided.

Other objects, features and advantages of the present invention will become apparent form the following detailed description of the illustrated embodiments when read in conjunction with the accompanying drawings in which corresponding components are identified by the same reference numerals.

BRIEF DESCRIPTION OF THE DRAWINGS

FIG. 3 is a diagram of a data structure of an encoded stream;

FIGS. 5A–5F are diagrams to which reference will be made in explaining encoded stream substitution processing performed by a variable-length-decoding section;

FIGS. 8A and 8B are diagrams to which reference will be made in explaining stream substitution processing performed by variable-length-decoding section 21;

FIGS. 9A–9C are diagrams to which reference will be made in explaining encoded stream substitution processing performed by variable-length-decoding section;

FIGS. 12A–12F are diagrams to which reference will be made in explaining a hierarchical structure of a MPEG stream;

FIGS. 13A–13F are diagrams to which reference will be made in explaining a hierarchical structure of a SX stream;

FIG. 20 is a diagram to which reference will be made in explaining a start-code emulation preventing processing performed by the stream conversion sections;

DETAILED DESCRIPTION OF THE PREFERRED EMBODIMENTS

An embodiment of the present invention will now be described with reference to the accompanying figures.

Figure 1:
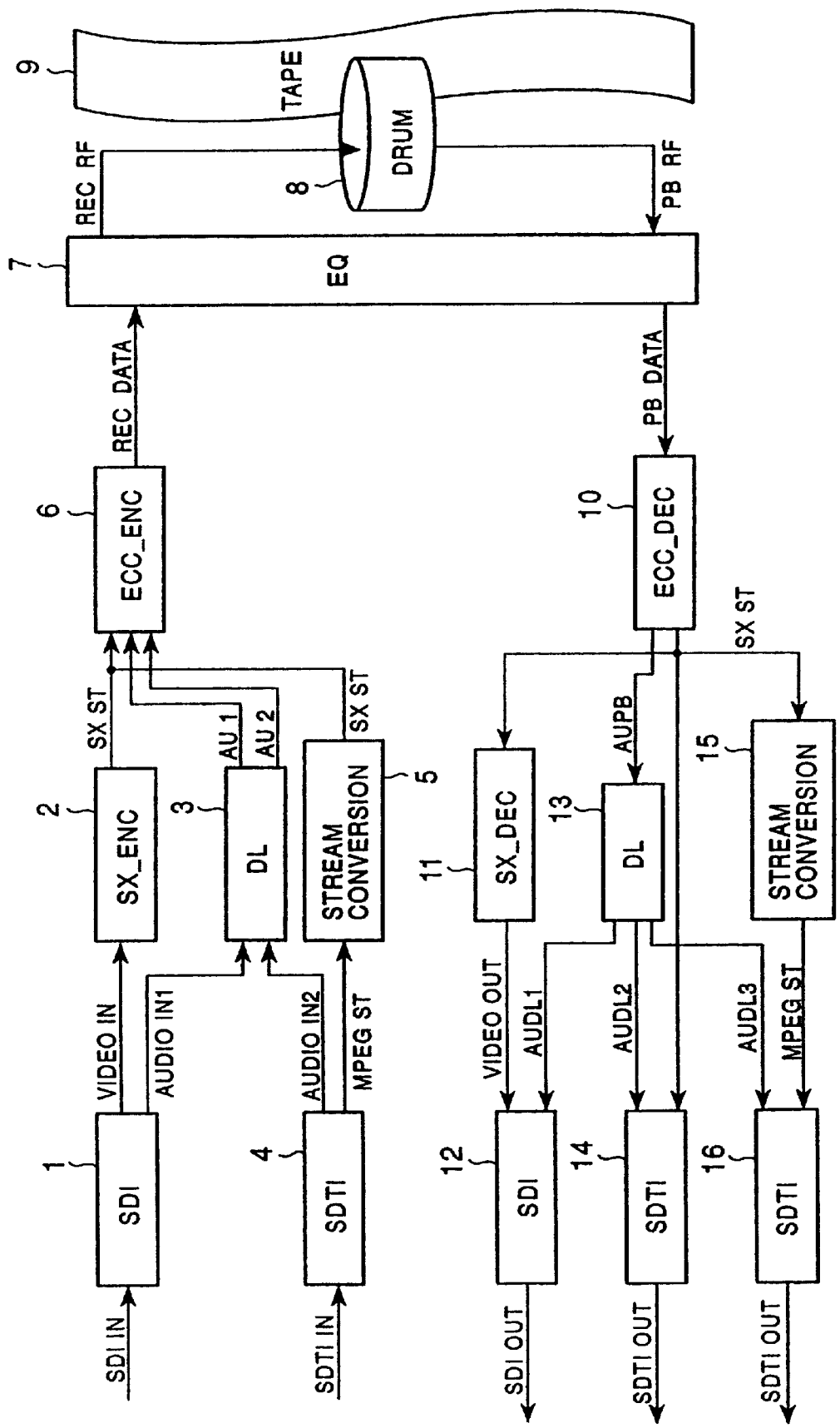
FIG. 1 is a diagram of a video cassette recorder to which the present invention is applied.

FIG. 1 illustrates a video cassette recorder to which the present invention is applied. Such video cassette recorder includes a recording section and a reproducing section. The recording system of the video cassette recorder will be initially described below.

A serial digital interface (SDI) section 1 receives source serial data SDI IN comprising a multiplexed video signal and audio signal. The SDI section 1 separates the source serial data SDI IN into a video signal VIDEO IN and an audio signal AUDIO IN1, and supplies the video signal VIDEO IN to a SX encoder (SX_ENC) 2 and the audio signal AUDIO IN1 to a delay section (DL) 3.

The SX encoder 2 applies compression encoding to the received video signal VIDEO IN to generate a SX stream SX ST in accordance with a predetermined SX encoding algorithm. The SX encoder 2 supplies the SX stream SX ST to an error correction code (ECC) encoder ($ECC_{13}ENC$) 6. The delay section 3 delays the audio signal AUDIO IN1 corresponding to the source video signal VIDEO IN by an amount corresponding to the time for encoding the source video signal VIDEO IN by the SX encoder 2. A delayed audio signal AU1 is supplied to the ECC encoder 6.

A serial digital transmitting interface (SDTI) section 4 receives a source SDTI signal SDTI IN comprising a multiplexed MPEG encoded video stream and audio signal, and outputs the MPEG stream MPEG ST to a stream conversion section 5 and outputs the audio signal AUDIO IN2 to the delay section (DL) 3.

The stream conversion section 5 performs stream processing so as to convert the MPEG stream MPEG ST into SX stream SX ST, and supplies the SX stream SX ST to ECC encoder (ECC_ENC) 6. The delay section 3 delays the audio signal AUDIO IN2 corresponding to the MPEG stream MPEG ST by an amount corresponding to the time for processing the MPEG stream by the stream conversion section 5. A delayed audio signal AU2 is supplied to the ECC encoder 6.

The ECC encoder 6 applies error correction coding to the SX stream SX ST and the audio signals AU1 or AU2 so as to generate recording data REC DATA and supplies the same to an equalizer (EQ) 7. The equalizer 7 converts the recording data REC DATA to a recording signal REC RF and supplies the same to a rotating drum (DRUM) 8. The rotating drum 8 supplies the received recording signal REC RF to recording heads so as to be recorded on a magnetic tape (TAPE) 9.

The structure of the reproduction system of the video cassette recorder will now be described.

A reproducing head(s) of the rotating drum 8 reproduces data recorded on the magnetic tape 9 and outputs a reproduced signal PB RF to the equalizer 7. The equalizer 7 applies phase equalization processing to the reproduced signal PB RF so as to produce reproduced data PB DATA and supplies the same to an ECC decoder (ECC_DEC) 10. The ECC decoder 10 performs error correction decoding on the reproduced data PB DATA and separates the same into a reproduced SX stream SX ST and reproduced audio data AUPB. The ECC decoder 10 supplies the reproduced SX stream SX ST to a SX decoder (SX_DEC) 11, a serial digital transmitting interface (SDTI) section 14, and a stream conversion section 15. Additionally, the ECC decoder 10 supplies the reproduced audio data AUPB to a delay section 13.

The SX decoder 11 decodes the reproduced SX stream SX ST in accordance with a predetermined SX decoding algorithm, which may be substantially opposite to the SX encoding algorithm performed by the encoder 2, and supplies the decoded video signal to a serial data interface (SDI) section 12. The delay section 13 delays the reproduced audio data AUPB by an amount corresponding to the duration of the SX decoding process performed by the SX decoder 11 and outputs a delayed audio signal AUDL1 to the SDI section 12.

The stream conversion section 15 converts the reproduced SX stream SX ST having the SX format into a MPEG stream having a MPEG format and supplies the same to a serial data transmitting interface (SDTI) section 16. The delay section 13 also delays the reproduced audio data AUPB by an amount corresponding to the duration of the stream conversion process performed by the stream conversion section 15 and outputs a delayed audio signal AUDL3 to the SDTI section 16.

The SDI section 12 generates a SDI signal by multiplexing the received video signal VIDEO OUT and audio signal AUDL1. The SDTI section 14 generates a SDTI signal by multiplexing the SX stream SX ST received from the ECC decoder 10 and an audio signal AUDL2 received from the delay section 13. The SDTI section 16 generates a SDTI signal by multiplexing the received MPEG stream MPEG ST and audio signal AUDL3.

Figure 2:
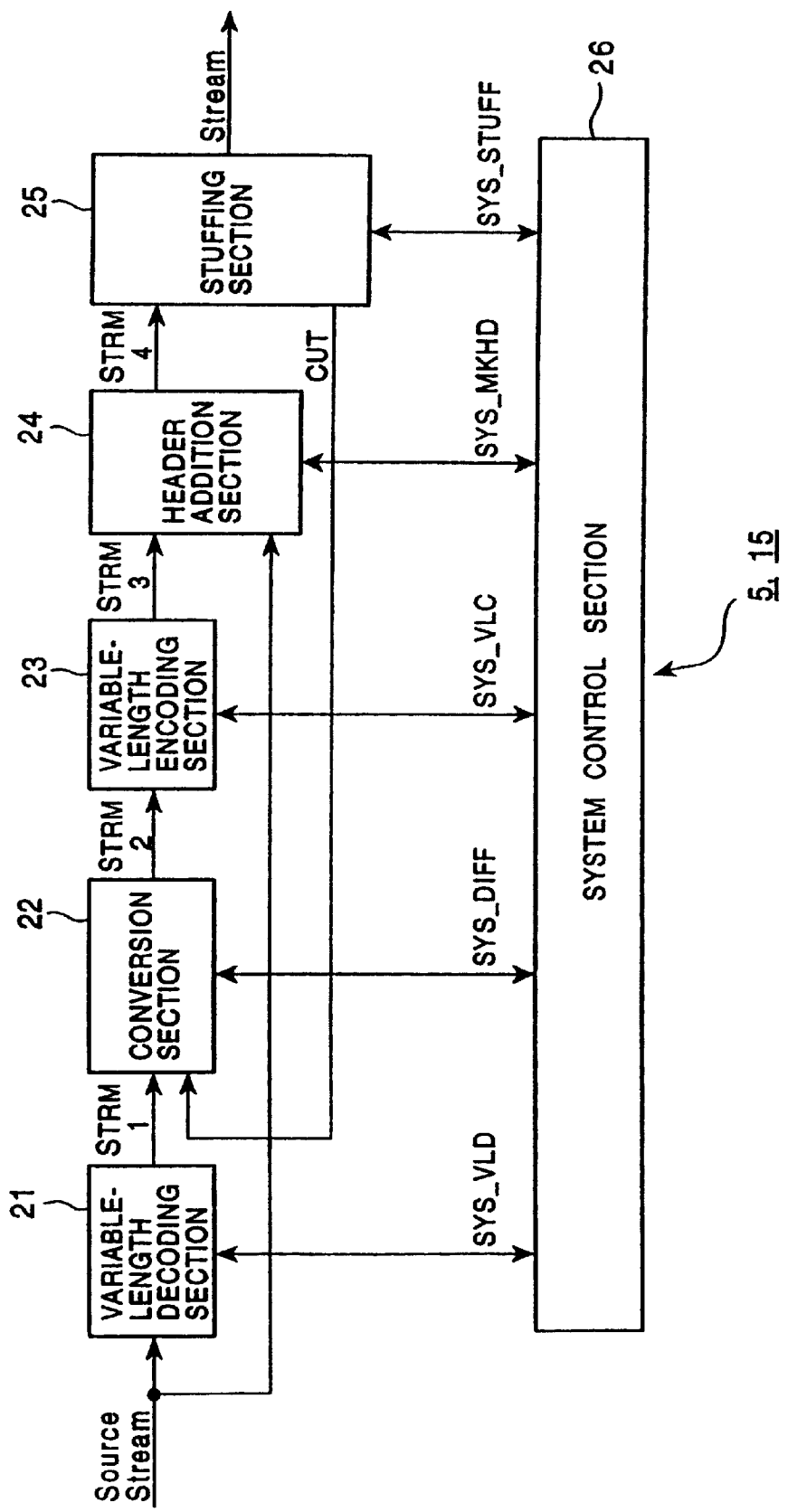
FIG. 2 is a diagram of stream conversion sections of the video cassette recorder of FIG. 1.

FIG. 2 illustrates stream conversion sections 5 and 15. As shown therein, each of the stream conversion sections 5, 15 may have a variable-length decoding (VLD) section 21, a conversion section 22, a variable-length-encoding (VLC) section 23, a header addition section 24, a stuffing section 25 and a system control section 26.

The variable-length decoding section 21 parses the syntax of the source encoded stream to extract a number of encoding parameters and data elements, and performs a variable length decoding process on the extracted coding parameters and data elements. Generally, an encoded stream which conforms to a MPEG standard includes variable-length data elements obtained from a variable length encoding process and fixed length data elements not obtained from a variable length encoding process. The variable-length decoding section 21 performs a variable length decoding process only on the variable-length data elements, such as DCT coefficients, in accordance with a variable length coding table.

Further, the variable-length decoding section 21 detects a syntax error in the source encoded stream based on a result of the parsing process. If the source encoded stream includes a syntax error, the variable-length decoding section 21 may substitute or replace the syntax error with a correct syntax so as to generate an encoded stream STRM1 having no syntax error.

The conversion section 22 performs a stream conversion process on the source encoded stream STRM1 so as to change a structure of the source encoded stream. For example, if the source encoded stream is a MPEG stream, it will be converted into a SX stream by the stream conversion process of the conversion section 22. On the other hand, if the source encoded stream is a SX stream, it will be converted into a MPEG stream by the stream conversion process of the conversion section 22.

The conversion section 22 also performs a bit rate changing process on the source encoded stream STRM1 in accordance with a control signal CUT supplied from the stuffing section 25. For example, when the control signal CUT has a value of "1", the conversion section 22 may change one or more non-zero AC components having high spatial frequency to zero. As a result, the conversion section 22 may control the bit rate of output bit stream STRM2.

The variable-length encoding section 23 applies a variable length encoding process to the stream STRM2 to generate a stream STRM3 having a plurality of coding parameters which are variable-length encoded by use of a variable length encoding table.

The header addition section 24 receives the stream STRM3 from the variable-length encoding section 23. The header addition section 24 prepares a plurality of coding parameters as header information of an output stream based on whether the source encoded stream is detected as a MPEG stream or a SX stream. Because the header information of each layer of a SX stream is different from that of a MPEG stream, the header addition section 24 may generate header information suitable for the SX stream or header information suitable for the general MPEG stream. The header addition section 24 adds the generated header information to the header areas of the stream STRM3 so as to form a stream STRM4 and outputs the same to the stuffing section 25.

The stuffing section 25 receives the stream STRM4 from the header addition section 24, and calculates a data amount or length of a group of pictures (GOPS) of the stream STRM4. If the calculated data amount of a respective GOP does not equal a predetermined value, the stuffing section 25 inserts stuffing bits or zero data into the area provided before the predetermined start code of the stream STRM4 so as to increase the data amount of the respective GOP. On the other hand, if the calculated data amount of the respective GOP exceeds a predetermined value, the stuffing section 25 outputs the control signal CUT to the conversion section 22 so as to decrease the amount of bits in the respective GOP.

The system control section 26 generates a control signal SYS_VLD and supplies such control signal to the variable-length decoding section 21 so as to control the same, generates a control signal SYS_DIFF and supplies such control signal to the conversion section 22 so as to control the same, generates a control signal SYS_VLC and supplies such control signal to the variable-length-encoding section 23 so as to control the same, generates a control signal SYS_MKHD and supplies such control signal to the header addition section 24 so as to control the same, and generates a control signal SYS_STUFF and supplies such control signal to the stuffing section 25 so as to control the same. Each of the sections 21–25 may supply information to the system control section 26.

The encoded stream processing for correcting a syntax error in the source encoded stream will now be described. Such processing may performed by the valuable length decoding section 21 of the stream conversion sections 5, 15.

As shown in FIG. 3, the encoded stream may comprise a sequence layer, a number of GOP (Group Of Pictures) layers, a number of picture layers, a number of slice layers and a number of macroblock layers. The sequence layer may include a sequence_header_code (SHC), header data including a plurality of coding parameters, extension data and a plurality of GOP layers. The GOP layer may include a group_start_code (GSC), header data including a plurality of coding parameters, extension data and a plurality of picture layers. The picture layer may include a picture_start_code (PSC), header data including a plurality of coding parameters, extension data and a plurality of slice layers. The slice layer may include a slice_start_code (SSC), header data including a plurality of coding parameters and one or more macroblock layers. The macroblock layer may include a plurality of coding parameters (macroblock_address_increment, macroblock_mode, quantizer_scale_code, motion_vectors, coded_block_pattern) and DCT coefficients.

When the variable length decoding section 21 parses the syntax of the source encoded stream, the variable length decoding section can detect or notice a boundary of layers or a boundary of data elements in accordance with predetermined start_codes, such as SHC, GSC, PSC or SSC, which may be provided at the start position of a layer. However, a predetermined start_code (such as SHC, GSC, PSC or SSC) may not be positioned at the start of a macroblock layer.

The DCT coefficients in the encoded stream may not be variable-length-decoded (VLD) data having a predetermined data length, but may be a variable-length-encoded (VLC) code. Specifically, DCT coefficients in the encoded stream may have been subjected to a variable-length-encoded process based on a zero-run-length of the source DCT coefficients and a level (non-zero) of the source DCT coefficients in accordance with a DCT coefficients table.

Therefore, if one of the macroblocks includes a syntax error, the parsing process to obtain the VLC codes of the coding parameters may not only fail for the macroblock having the syntax error, but may also fail for the macroblocks located after the respective macroblock having the syntax error.

Coding parameters for indicating a position of a macroblock in a picture will now be explained with reference to FIG. 4A and 4B.

Figure 4A:
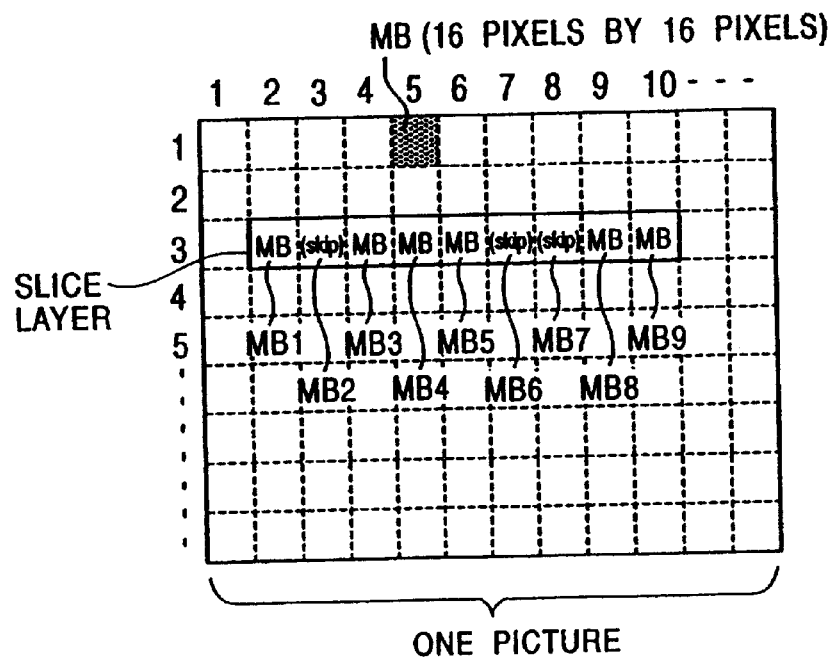
FIGS. 4A and 4B are diagrams of a slice layer of a picture and an encoded stream of the slice layer.

FIG. 4A illustrates a slice layer provided in a picture. The slice layer may include a first macroblock MB1, a second macroblock MB2, a third macroblock MB3, a fourth macroblock MB4, a fifth macroblock MB5, a sixth macroblock MB6, a seventh macroblock MB7, a eighth macroblock MB8, and a ninth macroblock MB9. The second macroblock MB2, the sixth macroblock MB6 and the seventh macroblock MB7 are so-called skipped-macroblocks. As such, the second macroblock MB2 may be assigned the same DCT coefficients as that of the first macroblock MB1, and the sixth and seventh macroblocks MB6, MB7 may be assigned the same DCT coefficients as that of the fifth macroblock MB5. Further, when the encoded stream is decoded by a MPEG decoder, the first macroblock MB1 may be repeated once so as to generate the second macroblock MB2, and the fifth macroblock MB5 may be repeated twice so as to generate the sixth and seventh macroblocks MB6 and MB7.

Figure 4B:
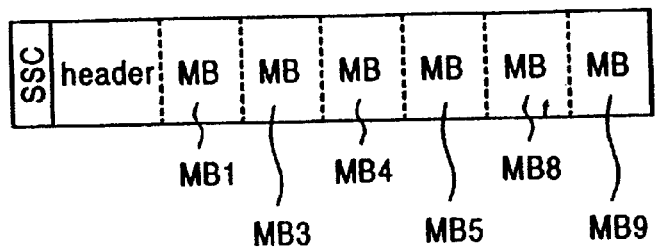

FIG. 4B illustrates the encoded stream of the slice layer of FIG. 4A. In such encoded stream, the skipped-macroblocks MB2, MB6 and MB7 are not described. The header area of the slice layer may include a plurality of coding parameters regarding the slice layer. For example, such coding parameters may include a "slice_vertical_position" which indicates a vertical position of the slice layer in the picture image.

The header area of a macroblock layer may include a plurality of coding parameters (such as "macroblock_address_increment") regarding the macroblock layer. If the respective macroblock is the top or first macroblock in the slice layer, the macroblock_address_increment indicates an absolute horizontal position or address of the respective macroblock. On the other hand, if the respective macroblock is not the top or first macroblock in the slice layer, the macroblock_address_increment may indicate the difference between the absolute horizontal address of the respective macroblock and the absolute horizontal address of the previous macroblock.

Therefore, in the arrangement of FIG. 4, the slice_vertical_position for the encoded stream is "3". Further, the macroblock_address_increment of the first macroblock MB1 is "2" which indicates the absolute horizontal position of the first macroblock; the macroblock_address_increment of the third macroblock MB3 in the encoded stream is "2" which indicates the difference of the absolute horizontal address of the first macroblock MB1 and the absolute horizontal address of the third macroblock MB3; the macroblock_address_increment of the fourth macroblock MB4 is "1" which indicates the difference of the absolute horizontal address of the third macroblock MB3 and the absolute horizontal address of the fourth macroblock MB4; the macroblock_address_increment of the fifth macroblock MB5 is "1" which indicates the difference of the absolute horizontal address of the fourth macroblock MB4 and the absolute horizontal address of the fifth macroblock MB5; the macroblock_address_increment of the eighth macroblock MB8 is "3" which indicates the difference of the absolute horizontal address of the fifth macroblock MB5 and the absolute horizontal address of the eighth macroblock MB8; and the macroblock_address_increment of the ninth macroblock MB9 is "1" which indicates the difference of the absolute horizontal address of the eighth macroblock MB8 and the absolute horizontal address of the ninth macroblock MB9.

Thus, the position of each macroblock can be obtained by referring to the slice_vertical_position described in the header area of the slice layer of the encoded stream and the macroblock_address_increment described in the header area of the macroblock layer of the encoded stream. Further, the total number of macroblocks in the slice layer can be obtained from the difference between the horizontal position of the top or first macroblock in a respective slice layer and the horizontal position of the top or first macroblock in the next slice layer. Furthermore, the number of the macroblocks which could not be decoded due to a syntax error can be obtained by subtracting the number of correctly decoded macroblocks from the total number of macroblocks in a respective layer.

The stream processing for correcting a syntax error performed in the variable-length decoding section 21 will now be described.

If a syntax error occurs in the fifth macroblock MB5 as shown in FIG. 5A, it may not be possible to variable-length-decode the macroblock MB5 and to variable-length-decode the sixth macroblock MB6 to the ninth macroblock MB9. Since the slice_start_code of each slice layer may be a predetermined fixed code, the slice_start_code of a subsequent slice layer may be detected regardless of the previous occurrence of a syntax error. Therefore, if a syntax error occurs in the fifth macroblock MB5 of a respective slice layer, all macroblocks (MB1', MB2', MB3', . . . ) included in the next slice layer can be decoded.

If a syntax error occurs in one macroblock of a respective slice layer, the total number of macroblocks included in the respective slice layer may not be determined by referring only to the coding parameters included in the respective slice layer. Specifically, the total number of macroblocks in a respective slice layer may be determined by subtracting the horizontal address of the top or first macroblock of the respective macroblock from the horizontal address of the top or first macroblock of the next macroblock. The number of macroblocks which can not be decoded due to a syntax error can be determined by subtracting the number of decoded macroblocks from the total number of macroblocks in the respective layer.

As an example of the above, and with reference to Fig. 5A, if the horizontal address of the first macroblock MB1 of a respective slice layer is "3", and the horizontal address of the first macroblock MB1' of the next slice layer is "12", the total number of macroblocks in the respective slice layer is "9" (=12−3). Further, if the four macroblocks from the first macroblock MB1 to the fourth macroblock MB4 had been decoded correctly, the number of macroblocks which could not be decoded is "35" (=9−4).

In the present stream processing, predetermined macroblocks which conform to a MPEG syntax may be substituted for the macroblocks which may not be correctly decoded due to a syntax error. Such predetermined macroblocks may include a black macroblock (whose luminance signal is 0×10 and whose color-difference signal is 0×80), a gray macroblock (whose luminance signal and color-difference signal are both 0×80), which has a minimum amount of generation bits, or a flat-pattern macroblock.

FIGS. 5 to 9 illustrate methods for substituting macroblocks which may not be able to be parsed variable-length-decoded correctly due to a syntax error with predetermined macroblocks having an acceptable or correct syntax. For example, when a syntax error occurs in the fifth macroblock MB5 as shown in FIG. 5A, the fifth macroblock MB5 to the last macroblock MB9 may be replaced with predetermined macroblocks having a correct syntax as shown in FIB. 5B. Alternatively, as shown in FIG. 5C, the fifth macroblock MB5 to the eighth macroblock MB8 may be assigned or designated as skipped macroblocks and the last macroblock MB9 may be replaced with a predetermined macroblock having a correct syntax. As another alternative, and as shown in FIB. 5D, the fifth macroblock MB5 and the last macroblock MB9 may be replaced with predetermined macroblocks having a correct syntax and the sixth macroblock MB6 to the eighth macroblock MB8 may be assigned or designated as skipped macroblocks. As yet another alternative, and as shown in FIG. 5E, the first macroblock MB1 to the ninth macroblock MB9 may be replaced with predetermined macroblocks having a correct syntax. Further, and as shown in FIG. 5F, the first macroblock MB1 and the last macroblock MB9 may be replaced with predetermined macroblocks having a correct syntax and the second macroblock MB2 to the eighth macroblock MB8 may be assigned or designated as skipped macroblocks.

Figure 6A:
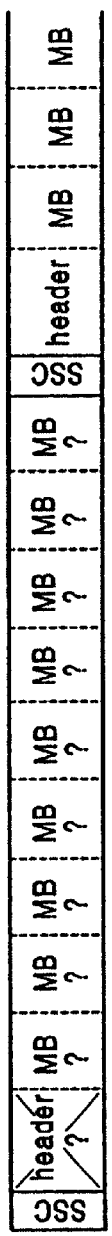
FIGS. 6A and 6B are diagrams to which reference will be made in explaining encoded stream substitution processing performed by variable-length-decoding section.
Figure 6B:
Figure 7A:
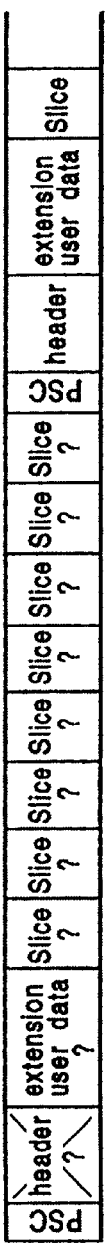
FIGS. 7A and 7B are diagrams to which reference will be made in explaining encoded stream substitution processing performed by variable-length-decoding section 21.
Figure 7B:

As shown in FIGS. 6A and 6B, if a syntax error occurs in the header area of a slice layer, all data elements of the slice layer may be replaced with a predetermined slice layer comprising a plurality of data elements having a correct MPEG syntax. As shown in FIGS. 7A and 7B, if a syntax error occurs in the header area of a picture layer, all data elements of the picture layer may be replaced with a predetermined picture layer comprising a plurality of data elements having a correct MPEG syntax. As shown in FIGS. 8A and 8B, if a syntax error occurs in the header area of a GOP layer, all data elements of the GOP layer may be replaced with a predetermined GOP layer comprising a plurality of data elements having a correct MPEG syntax. As shown in FIGS. 9A and 9B, if a syntax error occurs in the header area of a sequence layer, the sequence layer may be replaced with a predetermined sequence layer comprising a plurality of data elements having a correct MPEG syntax. Alternatively, as shown in FIG. 9C, the sequence_header_code (SHC) provided in the start position of the sequence layer having the syntax error may be replaced with a sequence_end_code (SEC) indicating an end of the video sequence.

Figure 10:
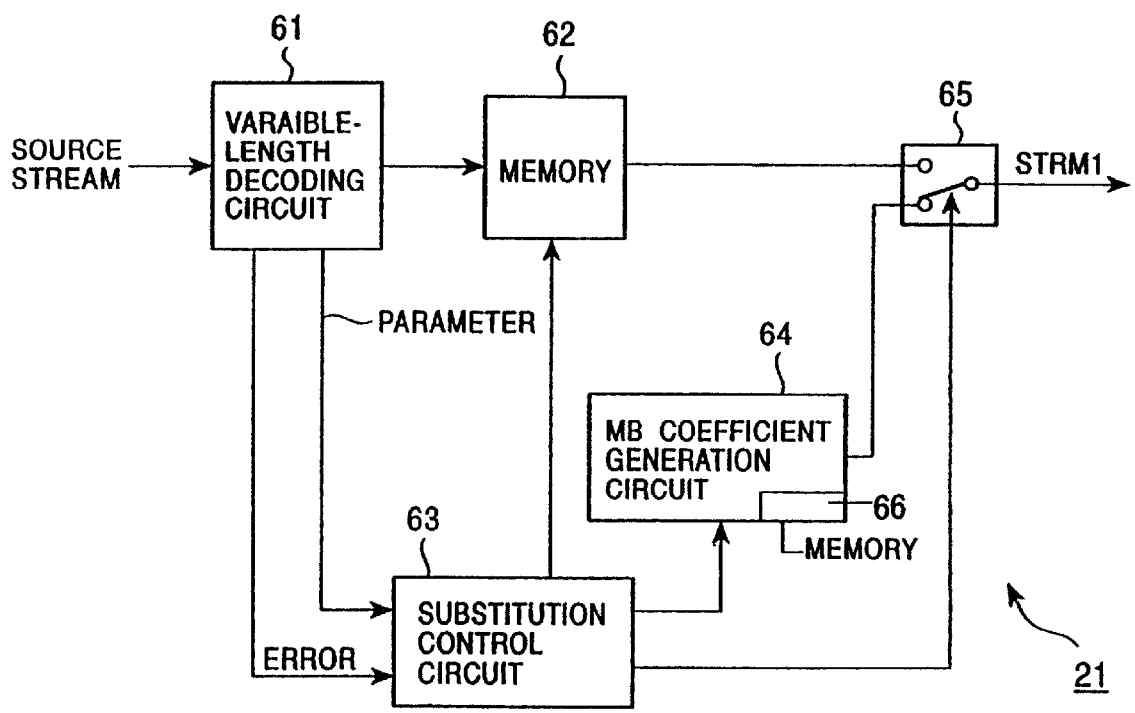
FIG. 10 is a diagram of the variable-length-decoding section according to an embodiment of the present invention.

FIG. 10 illustrates the variable-length decoding section 21 for performing the present stream processing wherein an encoded stream having a syntax error is replaced, in accordance with an embodiment of the present invention. As shown therein, the variable-length decoding section 21 may include a variable-length decoding circuit 61, a memory 62, a substitution control circuit 63, a macroblock (MB) coefficient generation circuit 64, and a switch 65.

The variable-length decoding circuit 61 parses the syntax of the source encoded stream, and detects or determines whether or not a syntax error has occurred in the source encoded stream in accordance with a result of the parsing process. Further, the variable-length decoding circuit 61 extracts variable-length encoded (VLC) codes indicating the coding parameters from the source encoded stream based on the parsing process. If a prohibitive VLC code, an undefined VLC code, a contradiction VLC code, or a parsing impossibility VLC code are detected in the source encoded stream by the parsing process, the variable-length decoding circuit 61 generates error information indicating that the source encoded stream includes a syntax error, and supplies the error information to the substitution control circuit 63. Furthermore, variable-length decoding circuit 61 performs a variable length decoding process on the extracted variable-length encoded codes to generate variable length decoded (VLD) data indicating coding parameters. The variable-length decoding circuit 61 analyses the VLD data of the coding parameters to detect a contradiction coding parameter or a coding parameter not defined in the MPEG standard or the like. If a contradiction coding parameter or an undefined coding parameter or the like is detected in the source encoded stream by the analyzing process, the variable-length decoding circuit 61 generates error information indicating that the source encoded stream includes a syntax error, and supplies the error information to the substitution control circuit 63. The variable-length decoding circuit 61 may also output various coding parameters which may have been obtained in the variable-length decoding process to the substitution control circuit 63.

The variable-length decoding circuit 61 may decode the source encoded stream so as to obtain a decoded stream and may supply the same to the memory 62 for storage therein.

The substitution control circuit 63 calculates the macroblock addresses of the macroblocks based on the respective slice_vertical_position and the macroblock_address_increment supplied from the variable-length decoding circuit 61 as the various coding parameters. Further, the substitution control circuit 63 calculates the total number of macroblocks in a respective slice layer by subtracting the macroblock address of the top or first macroblock in the respective slice layer from the macroblock address of the top or first macroblock in the next slice layer. Additionally, the substitution control circuit 63 may determine which macroblock has a syntax error by use of the error information supplied from the variable-length decoding circuit 61 and, as a result, the substitution control circuit 63 can calculate the number of macroblocks which may not be parsed or variable-length-decoded correctly due to the syntax error in accordance with the number of macroblocks which have been variable-length-decoded and the total number of macroblocks in the respective slice layer. The macroblocks which may not be parsed or variable-length-decoded correctly are the macroblocks to be replaced by the substitution process performed by the substitution control circuit 63. Furthermore, the substitution control circuit 63 controls the macroblock coefficient generation circuit 64 and the switch 65 in accordance with a result(s) of the calculation(s) performed therein.

The macroblock coefficient generation circuit 64 generates new macroblock data having an acceptable or correct syntax. Specifically, the macroblock coefficient generation circuit 64 may have a memory circuit 66 having various predetermined DCT coefficients stored therein to generate various kinds of new macroblocks. Such DCT coefficients may not be VLC code, but may be VLD data. As an example, when a macroblock having a black color is generated, the macroblock coefficient generation circuit 64 may generate coefficients having a value "0×10" for DCT coefficients of a luminance signal and may generate coefficients having a value "0×80" for DCT coefficients of a color-difference signal. As another example, when a macroblock having a gray color is generated, the macroblock coefficient generation circuit 64 may generate coefficients having a value "0×80" for DCT coefficients of a luminance signal and may generate coefficients having a value "0×80" for DCT coefficients of a color-difference signal.

The switch 65 switches to the appropriate one of the source encoded stream from the memory 62 and the DCT coefficient stream generated by the macroblock coefficient generation circuit 64 in response to a control signal from the substitution control circuit 63, such that the respective macroblock having a syntax error and the macroblocks which follow and/or which precede may be replaced with a new predetermined stream having a correct syntax.

Figure 11:
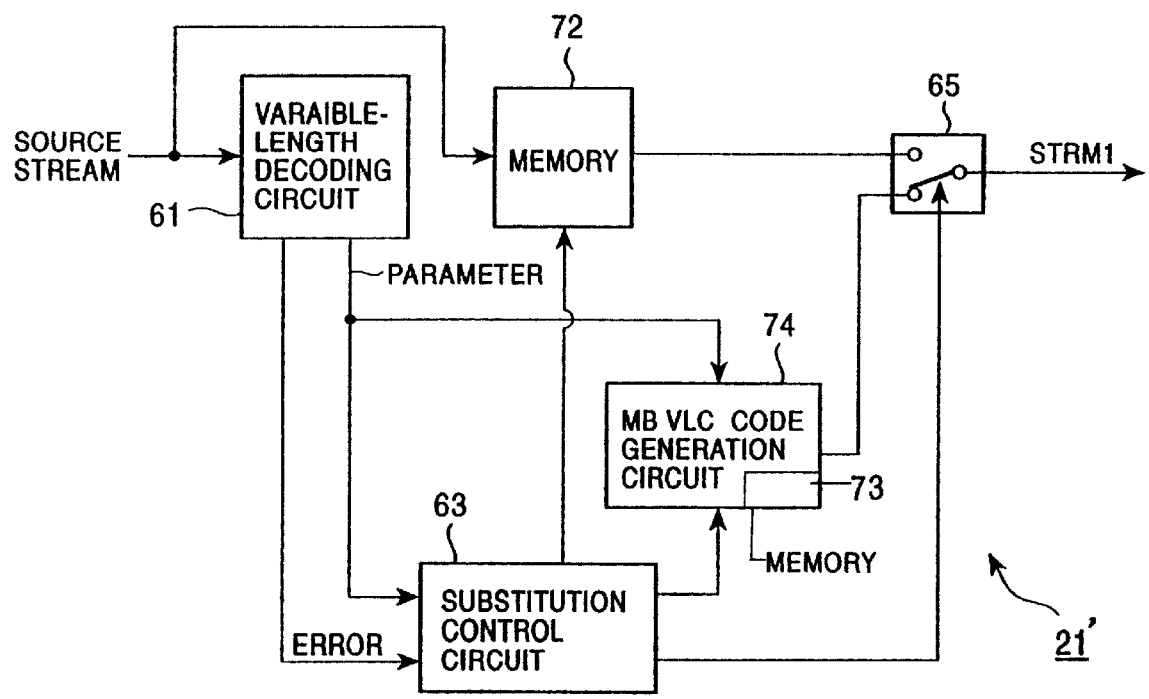
FIG. 11 is a diagram of the variable-length-decoding section according to an embodiment of the present invention.

FIG. 11 illustrates another embodiment of the present variable-length-decoding section for performing the stream processing to replace the source encoded stream having a syntax error. The variable-decoding section 21' may include the variable-length decoding circuit 61, a memory 72, the substitution control circuit 63, a macroblock VLC code generation circuit 74, and the switch 65. The configurations and functions of the variable-length decoding circuit 61, the substitution control circuit 63, and the switch 65 may be similar to those of the decoding section 21 shown in FIG. 10.

In the variable-length-decoding circuit 21', the memory 72 does not store a VLD data stream obtained from the variable-length-decoding process, but instead stores the source encoded stream having VLC codes which may be obtained prior to the variable-length-encoding process.

The macroblock VLC code generation circuit 74 generates the VLC code to be used as a substitute or replacement for the source encoded stream output from the memory 72. Specifically, the macroblock VLC code generation circuit 74 may have a memory 73 for storing predetermined information such as macroblock data having VLC codes indicating a black color or a gray color, P-picture macroblock data having VLC codes indicating simple interframe prediction, B-picture macroblock data having VLC codes indicating the same prediction direction and a motion vector(s) of a previous macroblock. The macroblock VLC code generation circuit 74 outputs the predetermined macroblock data having VLC codes in accordance with a control signal supplied from the substitution control circuit 63.

The switch 65 switches to the appropriate one of the VLC code stream of the source encoded stream supplied from the memory 72 and the VLC code stream indicating the DCT coefficient(s) generated by the macroblock VLC code generation circuit 74 in response to a control signal from the substitution control circuit 63, such that the macroblock which may not be parsed or variable-length-decoded correctly due to a syntax error and/or the macroblock(s) which precede or succeed therefrom may be substituted or replaced with a predetermined stream having an acceptable or correct syntax.

Since the above-described stream processing performs variable-length encoding and variable-length decoding and does not perform quantization and inverse quantization, the quality of the image obtained therefrom may not be adversely affected.

Thus, according to the stream processing apparatus of the present invention, since a macroblock having a syntax error in the source encoded stream is replaced with a new macroblock having a correct syntax, acceptable stream processing may be obtained regardless of the syntax error in the source parsing process.

To further explain the processing of the conversion section 22, an example of a MPEG stream and a SX stream will now be described below with reference to FIGS. 12 to 16.

FIG. 12 illustrates a hierarchical structure of a MPEG standard, such as the 4:2:2@ML (4:2:2 profile@main level) standard of MPEG 2.

As shown in FIG. 12A, a sequence layer may include a number of sets each having a sequence header code (SHC: sequence_header_code), a header section, an extension section, and a number of GOPs (groups of pictures). At the end of the sets or sequence, a sequence end code (SEC: sequence_end_code) may be disposed.

As shown in a GOP layer of FIG. 12(B), a GOP from FIG. 12A may include a group start code (GSC: group_start_code) at the top, a header section, an extension section, and a number of pictures. A picture can be an intra-frame encoded image (I picture: intra picture), a forward predictive encoded image (P picture: predictive picture), or a bidirectionally predictive encoded image (B picture: bidirectionally predictive picture). These I, P, and B pictures may be disposed in a predetermined order to form a GOP.

As shown in a picture layer of FIG. 12(C), a picture from FIG. 12B may include a picture start code (PSC: picture_start_code), a header section, an extension user data section, and a number of slices.

As shown in a slice layer of FIG. 12(D), a slice of FIG. 12C may include a slice start code (SSC: slice_start_code), header section, and a number of macroblocks (MB: macroblock).

As shown in a MB (macroblock) layer of FIG. 12(E), a macroblock MB of FIG. 12D may include an address, a mode, a quantizer scale code (qsc: quantizer_scale_code), a motion vector (mv: motion_vector), a code block pattern (cbp: coded_block_pattern), and a predetermined number of blocks. A block may be formed of eight by eight DCT coefficients obtained by applying DCT (discrete cosine transform) to a DCT block of eight by eight pixels. In 4:2:2profile@main level, one macroblock MB may be formed of eight DCT blocks, that is, four luminance-signal blocks Y0, Y1, Y2, and Y3, and two types of two color-difference-signal blocks Cb0 and Cb1, and Cr0 and Cr1.

The eight by eight DCT coefficients in one DCT block may be arranged such that a DC component is disposed at the upper left corner and AC components are disposed in an order from a low spatial frequency to a high spatial frequency, in the direction from the upper left to the lower right. A so-called zigzag scanning method may be utilized in which the DCT coefficients in this block are taken out in a predetermined order and variable length coding is applied. In addition to zigzag scanning, a so-called alternate scanning method may be utilized. Either zigzag scanning or alternate scanning can be switched and used in units of pictures. The alternate scanning method is suited for encoding of an interlaced image since interlaced components can be efficiently taken out.

FIG. 12(F) illustrates an encoded data string obtained by applying variable-length or entropy encoding (such as Huffman coding) to a one-dimensional DCT coefficient string obtained for each DCT block. Encoded data may be represented by rAC-1 [y0] and so forth as shown in FIG. 12(F). In variable length encoding, a code rAC** may be determined by a zero-run length and a no-zero level.

The SX stream corresponding to the above MPEG stream may have a hierarchical structure as shown in FIG. 13.

In the format shown in FIG. 13, one GOP in a GOP string of a sequence layer shown in FIG. 13(A) may include two frames, that is, an I picture and a B picture as shown in a GOP layer of FIG. 13(B). This structure may correspond to a SX stream for use with a video tape recorder. The SX stream itself may have a GOP with up to 30 frames, including I, P, and B pictures. When the SX stream is used with a video tape recorder, stuffing may be performed so to perform a recording operation on a tape with a GOP having a constant length.

A picture layer shown in FIG. 13(C) and a slice layer shown in FIG. 13(D) may conform somewhat to the MPEG standard described with reference to FIG. 12, as well as the sequence layer shown in FIG. 13(A) and the GOP layer shown in FIG. 13(B). Since such layers may not have header information, various types of header information may be added to the Sx stream when it is converted to a MPEG stream.

The order in which DCT coefficients are arranged in a macroblock MB layer, such as that shown in FIG. 13(F), may be different from that of the MPEG format shown in FIG. 12(F). That is, as shown in the encoded data of FIG. 13(F), the DC components of the eight DCT blocks Y0 to Cr1 may be respectively arranged first, and then the AC components of the DCT coefficients corresponding to frequencies in the DCT blocks may be sequentially arranged in units of eight coefficients from a low spatial frequency to a high spatial frequency. As a result, in the macroblock MB, DC components and low spatial frequency AC components, which may be important in image reproduction, are closely arranged.

Advantages of the above-described arrangement of DCT coefficients will be described below with reference to FIGS. 14A and 14B and FIGS. 15A and 15B.

When the MPEG stream and the SX stream described above are recorded in slanted helical tracks on a video tape with the use of a rotating head and reproduced at a relatively high speed, since the slanted angle of a head trace may differ from the slanted angle of the helical tracks (which serve as recording tracks), only a part of the data on the helical tracks may be reproduced. Even if error correction is applied, only a part of a macroblock MB may be effectively reproduced and the remainder may not be reproduced and, as such, may be considered as an error.

Figure 14A:
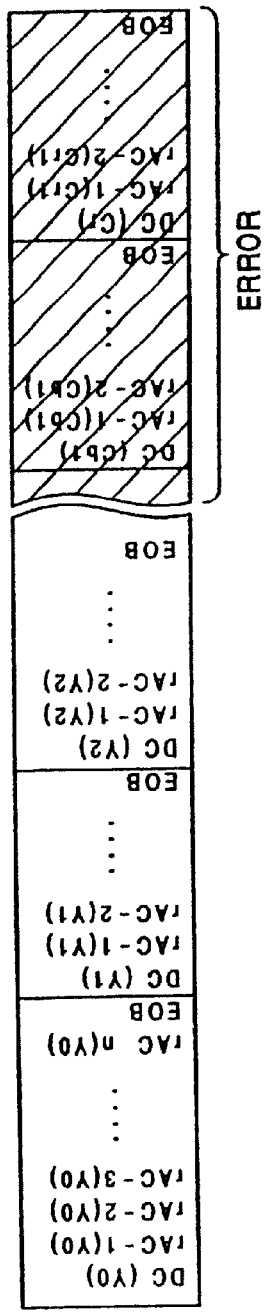
FIGS. 14A and 14B are diagrams to which reference will be made in explaining an error condition in a coefficient stream of a MPEG stream.
Figure 14B:
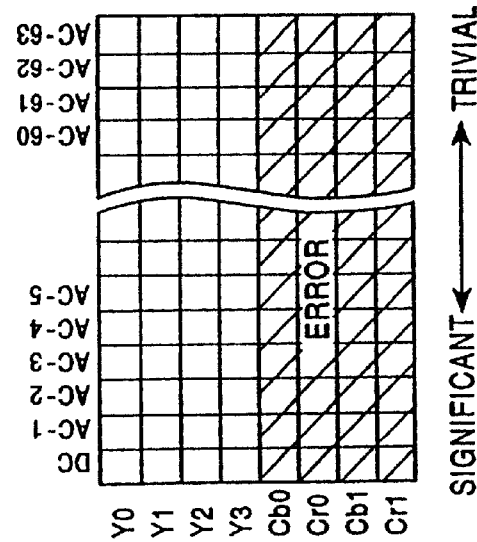

FIGS. 14A and 14B illustrate a situation in which data recorded on a video tape with MPEG2 format (described above as an example of the MPEG stream) is reproduced at a relatively high speed. Hatched portions indicate error areas wherein correction may not be possible. FIG. 14A illustrates a one-dimensional arrangement of DCT coefficients in the encoded data in a macroblock. FIG. 14B illustrates a two-dimensional arrangement of the DCT coefficients obtained by decoding the encoded data, in which the horizontal axis indicates the spatial frequency and the vertical axis indicates the DCT block. In the example shown in FIG. 14B, since the DCT blocks Y0, Y1, Y2, and Y3 of the luminance signals Y may be effectively reproduced and the DCT blocks Cb0, Cr0, Cb1, and Cr1 of the color-difference signals may be considered erroneous or may not be effectively reproduced, video without color components may be obtained. If the color-difference signal Cb0 is effectively reproduced, an unusual color may be obtained . When the luminance signal Y3 becomes erroneous, a part of the DCT blocks in the macroblock becomes lacking. Such reproduced image is unsightly and not preferred.

Figure 15A:
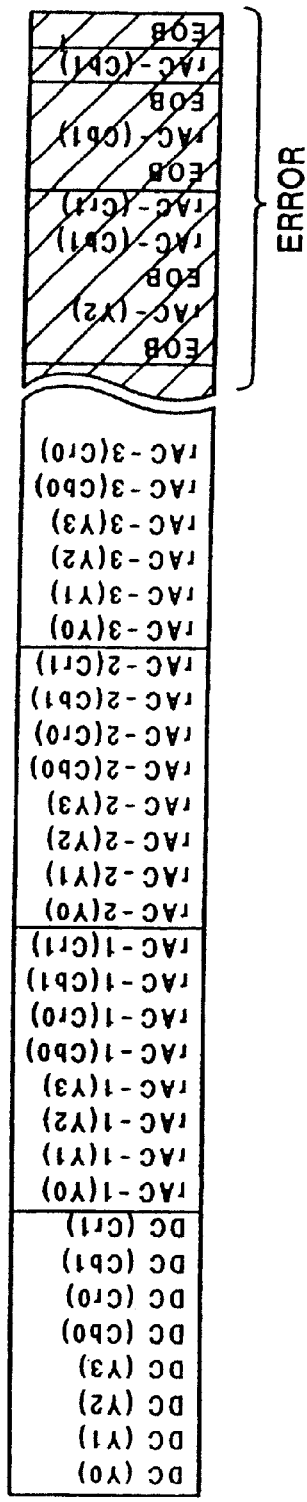
FIGS. 15A and 15B are diagrams to which reference will be made in explaining an error condition in a coefficient stream of the SX stream.
Figure 15B:
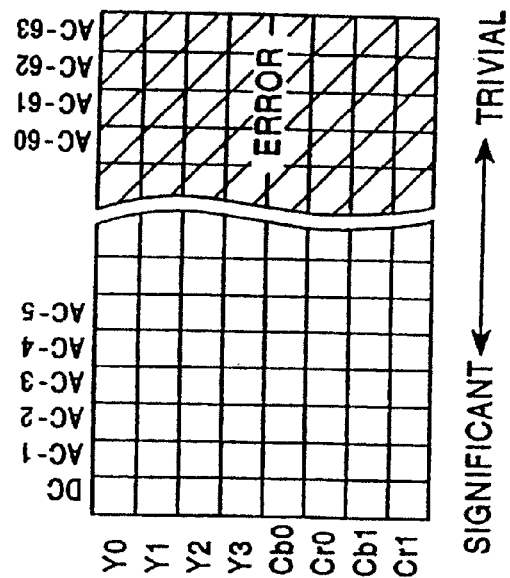

On the other hand, when data recorded on a video tape with the SX stream is reproduced at a relatively high speed, a hatched portion in a one-dimensional arrangement shown in FIG. 15A may be considered erroneous or may not be effectively reproduced. As shown in FIG. 15B, DC components and low-frequency AC components important for image reproduction may be effectively reproduced for all DCT blocks in the macroblock. As a result, a fairly acceptable reproduced image may be obtained.

In high-speed reproduction, an error may occur at a different position in each macroblock. If DC components and low-frequency AC components are not effectively obtained in a macroblock, an effective image for a previous frame may be displayed instead of using the data of that macroblock. The displayed image may be partially updated in units of macroblocks, and may not provide an unacceptable image to a viewer.

In the SX stream, the zigzag scanning and the alternate scanning, can be switched in units of macroblocks so as to improve image quality. Specifically, it may be advantageous to use frame DCT and zigzag scanning in combination for a frame image (sequentially scanned image) having a small motion, and to use field DCT and alternate scanning in combination for an interlaced image having a large motion. In the SX stream, by enabling these combinations to be switched in units of macroblocks, more precise adjustment may be performed and image quality may be improved.

On the other hand, in the MPEG stream, only one scanning type may be used in a picture. In other words, the DCT type may be switched between field DCT and frame DCT in units of macroblocks, but the scanning type may not be changed in units of macroblocks.

When the scanning type is switched in units of macroblocks in the SX stream, the conversion section 22 may re-arrange DCT coefficients so that the scanning type used in a picture matches that of the MPEG stream.

Processing for converting the SX stream to the MPEG stream will now be described with reference to FIGS. 16A to 16D.

Figure 16A:
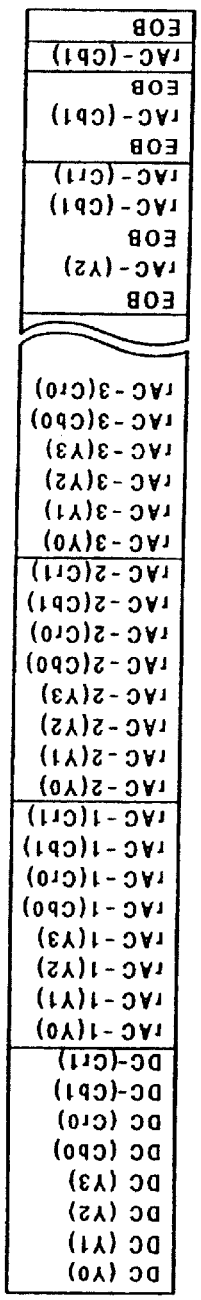
FIGS. 16A–16D are diagrams to which reference will be made in describing a stream conversion operation.
Figure 16B:
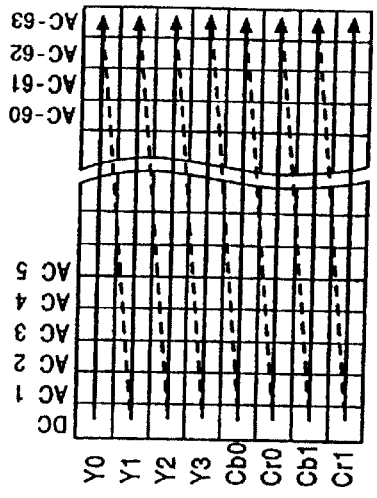
Figure 16C:
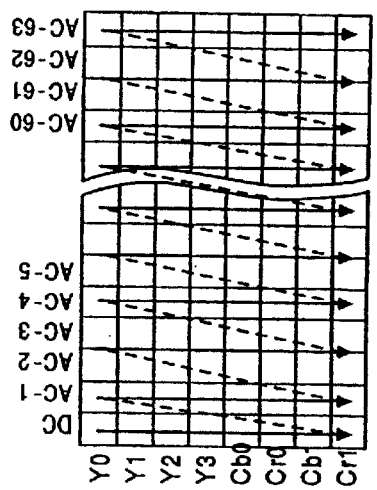
Figure 16D:
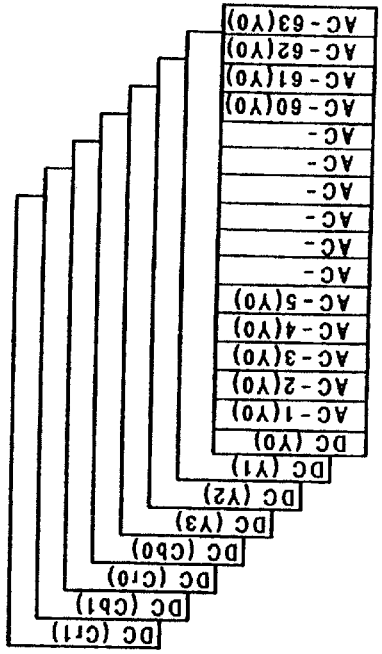

FIG. 16A illustrates a one-dimensional arrangement of encoded data of DCT coefficients of a macroblock in an encoded SX data stream. The conversion section 22 may detect the first encoded data DC[Y0] in this macroblock to make data delimitation clear. The encoded data may be written into a memory of the conversion section 22 in the order indicated by the arrows in FIG. 16B from the first encoded data DC[Y0]. FIG. 16B shows that, for example, encoded AC coefficient data AC-2 and AC-3 may be at the same time stored in the memory when a DCT block including the coefficient AC-2 and a DCT block including the coefficient AC-3 are derived by tracing the helical track. The coefficient data stored in the memory of the conversion section 22 may be converted to the order of the MPEG stream by reading DC components and AC components in the order from a low spatial frequency to a high spatial frequency (such as shown in FIG. 16C) in each DCT block. When the scanning type (zigzag scanning or alternate scanning) is switched in units of macroblocks in the SX stream, the DCT coefficients may be re-arranged so that the scanning type used in a picture matches that of the MPEG stream. Such processing may correspond to that performed in the conversion section 22.

Figure 17:
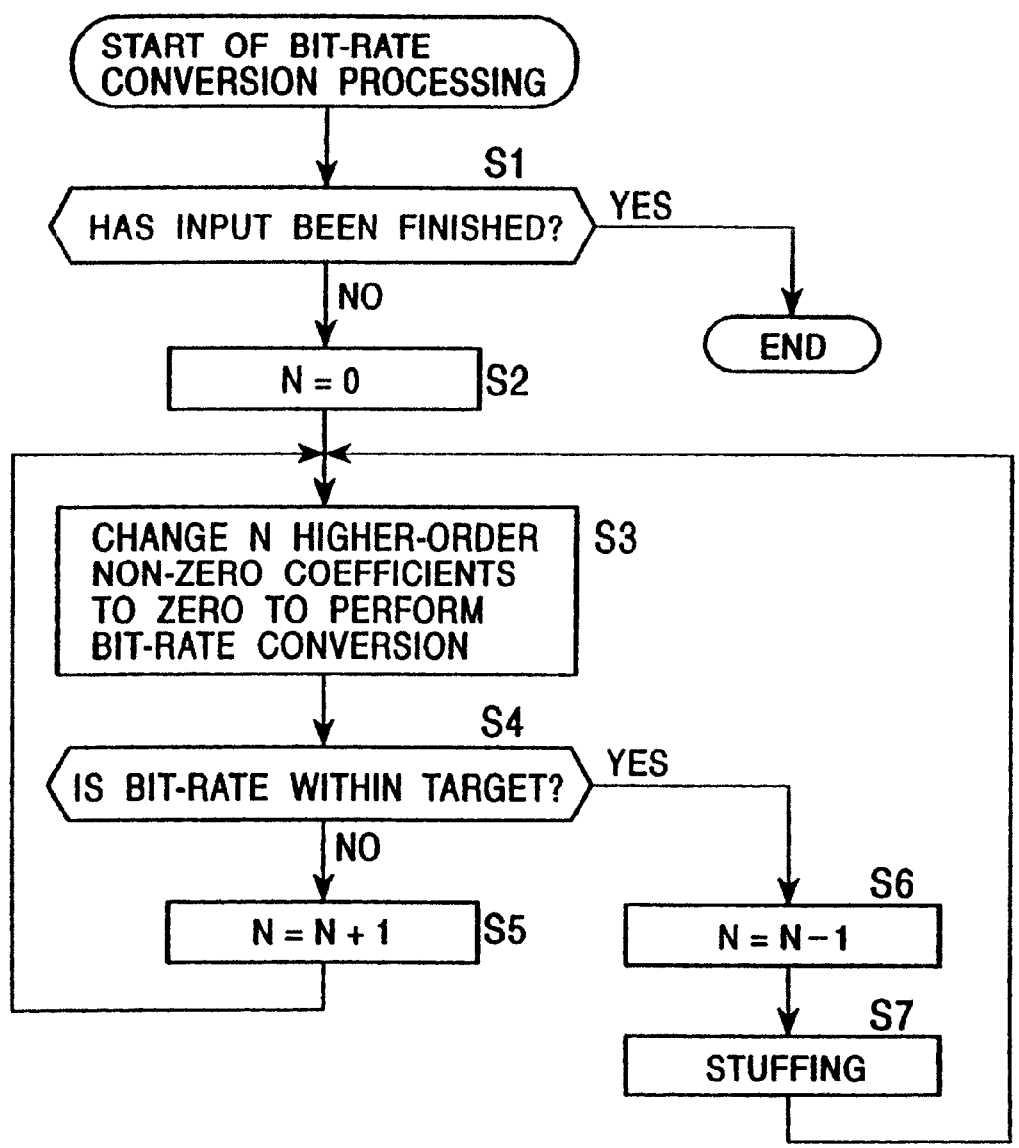
FIG. 17 is a flowchart of a bit-rate conversion processing performed in the stream conversion sections.

Next, a bit-rate conversion processing of the conversion section 22 will be described below by referring to a flowchart shown in FIG. 17. This processing starts when the variable-length decoding section 21 inputs the video stream STRM1 to the conversion section 22.

In step S1, the conversion section 22 determines whether the variable-length decoding section 21 has input the source stream. When it is determined that the stream inputting has been finished, the processing is finished. When it is determined that the stream inputting has not been finished, the processing proceeds to a step S2. In the step S2, the conversion section 22 initializes a parameter N (N ranges from 0 to 63) indicating the position of a DCT coefficient from the highest-order DCT coefficient to zero.

In step S3, the conversion section 22 changes N non-zero coefficients from the highest-order DCT coefficient to zero and supplies an output to the variable-length encoding section 23. The variable-length encoding section 23 applies variable-length encoding to a portion where variable-length encoding has not been applied in the input stream, and supplies an output to the header addition section 24. The header addition section 24 adds header information prepared in advance to the input stream and supplies an output to the stuffing section 25.

In step S4, the stuffing section 25 determines whether the bit rate of the stream STRM4 input from the header addition section 24 is not larger than the bit rate specified in advance. When the bit rate of the input stream is larger (exceeds) the bit rate specified in advance, the processing proceeds to a step S5. In step S5, the stuffing section 25 sets the control signal CUT to "1" and outputs it to the conversion section 22. Corresponding to this control signal CUT, the conversion section 22 increments the parameter N by 1 and the processing returns to step S3.

Until it is determined in step S4 that the bit rate of the stream STRM4 input to the stuffing section 25 is not larger than the bit rate specified in advance, processing from step S3 to step S5 is repeated. When it is determined in the step S4 that the bit rate of the stream output to the stuffing section 25 is not larger than the bit rate specified in advance, the processing proceeds to a step S6.

In step S6, the conversion section 22 decreases the parameter N by 1 according to control of the system controller interface 26, and processing returns to step S3.

In step S7, the stuffing section 25 inserts a stuffing bit of "0" into the stream STRM4 until the bit rate of the input stream STRM4 reaches the bit rate specified in advance. Details of the stuffing processing will be described below with reference to FIG. 18.

Figure 18:
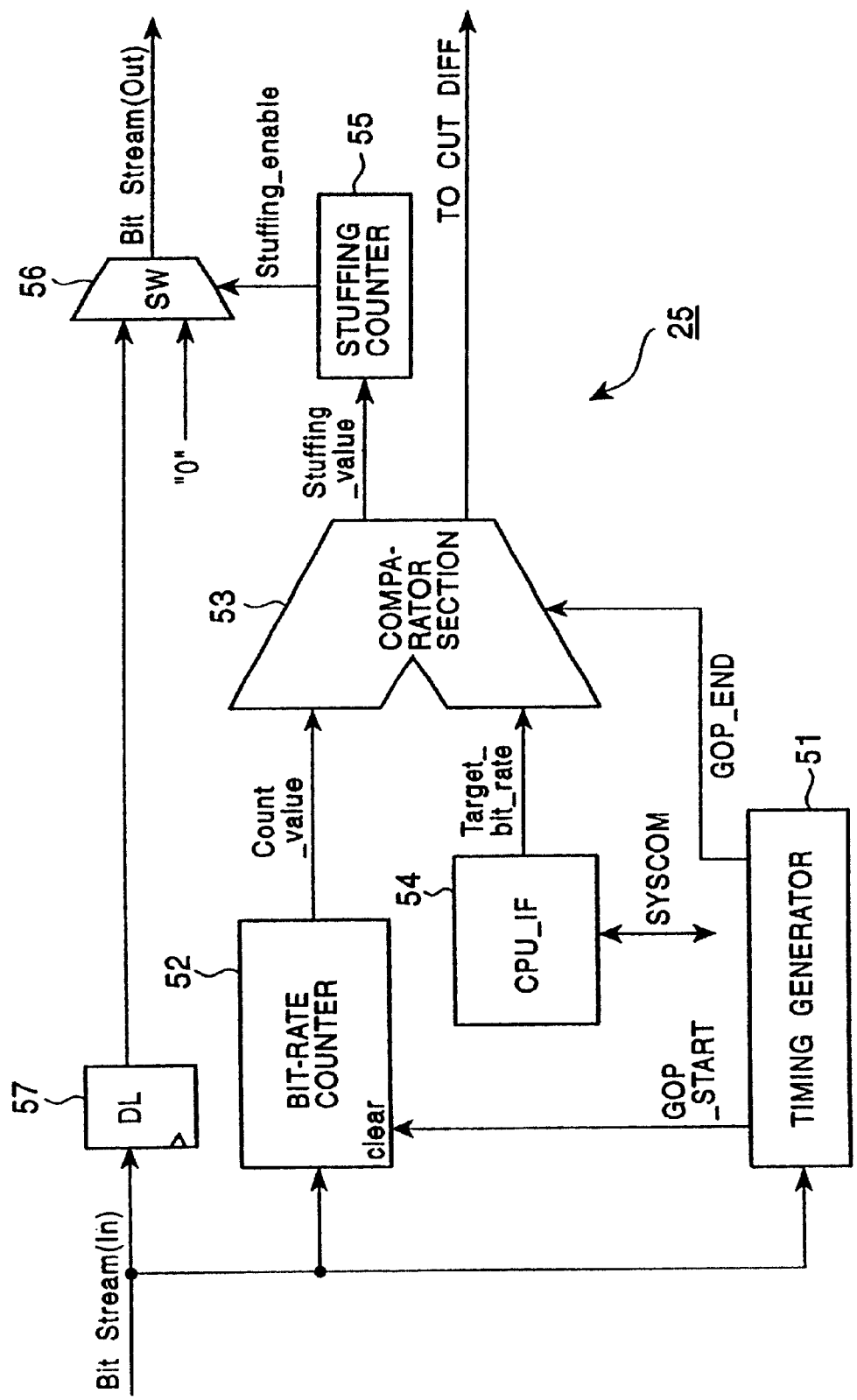
FIG. 18 is a diagram of a stuffing section.

FIG. 18 shows a structure of the stuffing section 25. The bit stream (corresponding to the output stream STRM4 shown in FIG. 2) input to the stuffing section 25 (FIG. 2) is sent to a timing generator 51, a bit-rate counter 52, and a delay section (DL) 57.

Figure 19:
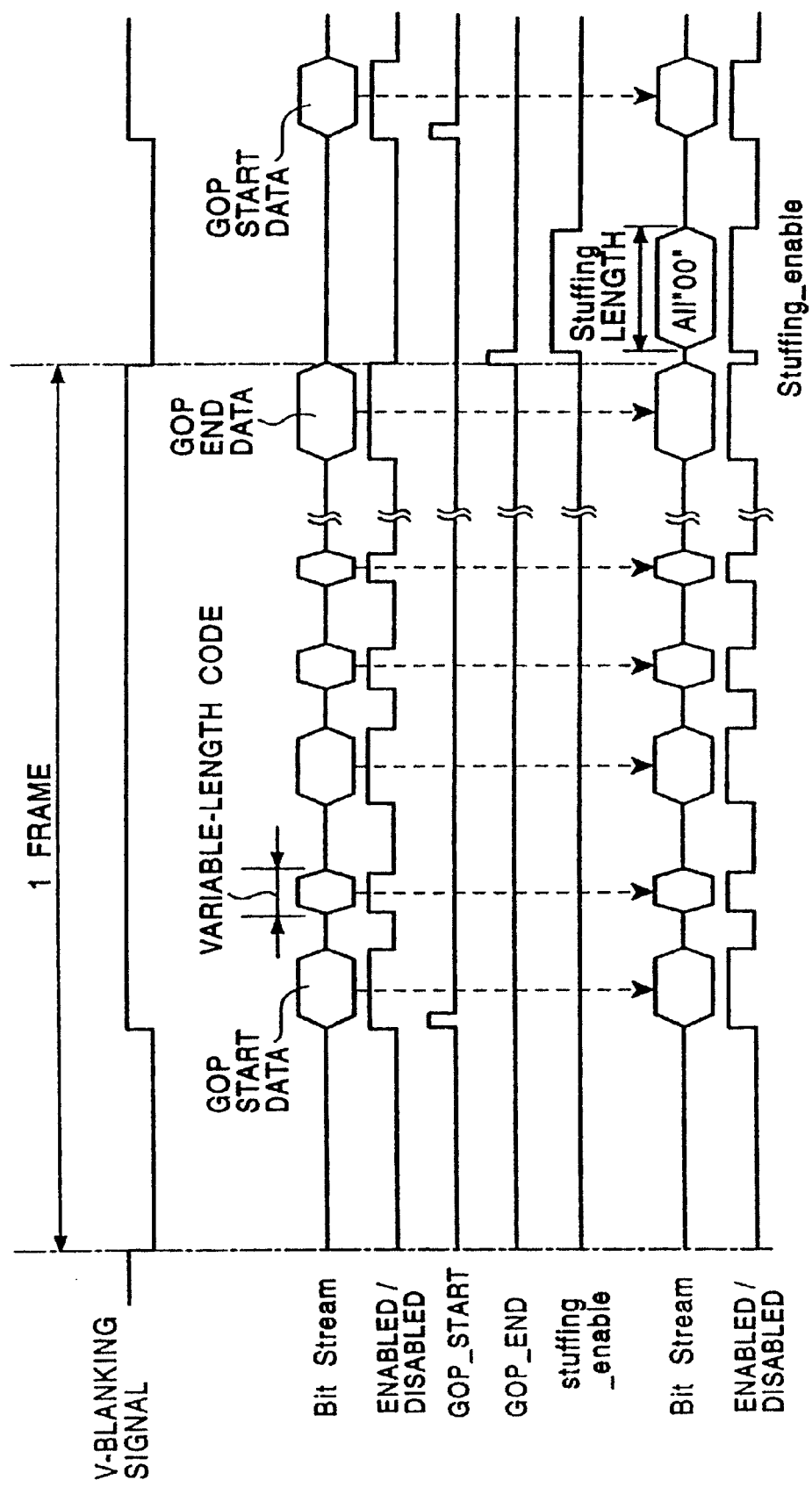
FIG. 19 is a diagram to which reference will be made in explaining stuffing processing performed by the stuffing section.

The timing generator 51 detects a V-Blanking signal (corresponding to a signal indicating a vertical blanking period in each field of a usual video signal) in each frame, which is included in a bit stream and which indicates a period in which effective data does not exist in the bit stream as shown in FIG. 19. The timing generator 51 generates a GOP_START signal in synchronization with the timing when the V-Blanking signal is released (when effective data appears), and outputs it to the bit-rate counter 52. The bit-rate counter 52 resets its counter in synchronization with the GOP_START signal, counts the amount of effective codes included in the bit stream, and outputs the count to a comparator section 53.

The timing generator 51 generates a GOP_END signal in synchronization with the timing when a V-Blanking signal is again generated (when effective data disappears), and outputs it to the comparator section 53 (it is assumed that one GOP corresponds to one picture).

The comparator section 53 compares the count indicating the amount of effective codes input from the bit-rate counter 52 with a bit rate Target_bit_rate specified in advance in a CPU interface (CPU_IF) 54 (corresponding to the system control section 26 shown in FIG. 2), in synchronization with the timing when the GOP_END signal is input. When the count is less than the bit rate Target_bit_rate, the comparator section 53 outputs a signal Stuffing_value indicating the difference therebetween to a stuffing counter 55.

The stuffing counter 55 executes counting operations (time-measuring operations) by the value of the input difference signal Stuffing_value, and outputs a signal Stuffing_enable to a switch 56 during the counting operations. The switch 56 receives the bit stream to which a delay corresponding to the processing performed from the timing generator 51 to the stuffing counter 55 is applied and stuffing bits of "0" from the delay section 57. The switch 56 stuffs the bit stream with bits of "0" while it is receiving the Stuffing_enable signal.

On the other hand, when the comparator section 53 determines that the count is larger than the Target_bit_rate bit rate, the comparator section 53 sets the control signal CUT to "1" and outputs it to the conversion section 22 (FIG. 2). As described above, the conversion section 22 changes higher-order non-zero coefficients of the DCT coefficients to zero corresponding to this control signal CUT.

As described above, in the present embodiment, since stuffing is performed in a period when a V-Blanking signal included in a video signal exists, packing is unnecessary. Therefore, a memory for packing is unnecessary. In addition, since packing is not performed, a system delay can be set to the minimum (real-time processing can be performed).

Next, a start-code-emulation preventing processing in the stream conversion sections 5, 15 will be described. This processing is executed mainly by the header addition section 24. As described above, the stream conversion sections 5, 15 executes the processing for converting the structure of the source encoded stream. Since information unique to the SX stream, such as video editing information, may not be specified in the MPEG stream, the unique information is described in the user data field in the MPEG stream. The user data field in the MPEG stream does not have any special rule (free format) unlike the other data fields in the MPEG stream. Any information can be described therein, but start-code emulation may occur.

Start-code emulation will be described below. In the encoded stream, as a special data pattern indicating the top of each data field, a combination of successive 23 bits of "0" and the following one bit of "1" is specified as the start code. In the data fields other than the user field, successive 23 bits of "0" is not allowed except for the top of each field. Since any data can be written into the user data field, the user needs to consciously write data without specifying successive 23 bits of "0."

Start-code emulation refers to a case in which data specified in the user data field accidentally matches the start code. This case may cause a serious error.

In the present embodiment, the header addition section 24 inserts marker bits of "1" at every 16 bits in the user data field to prevent start-code emulation as shown in FIG. 20.

Figure 21:
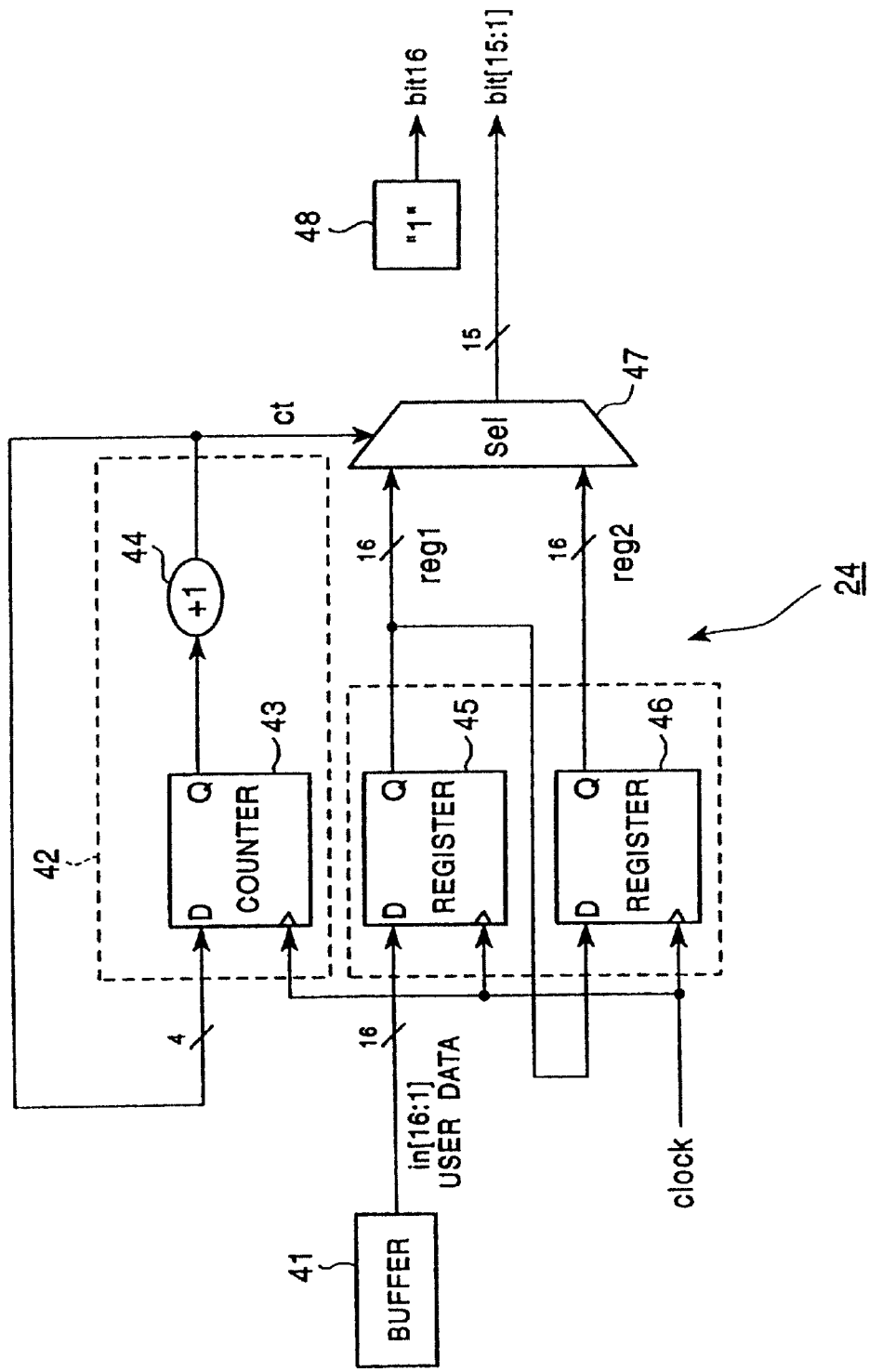
FIG. 21 is a diagram of a portion related to the start-code emulation preventing processing in a header addition section of the stream conversion section shown in FIG. 2.
Figure 22:
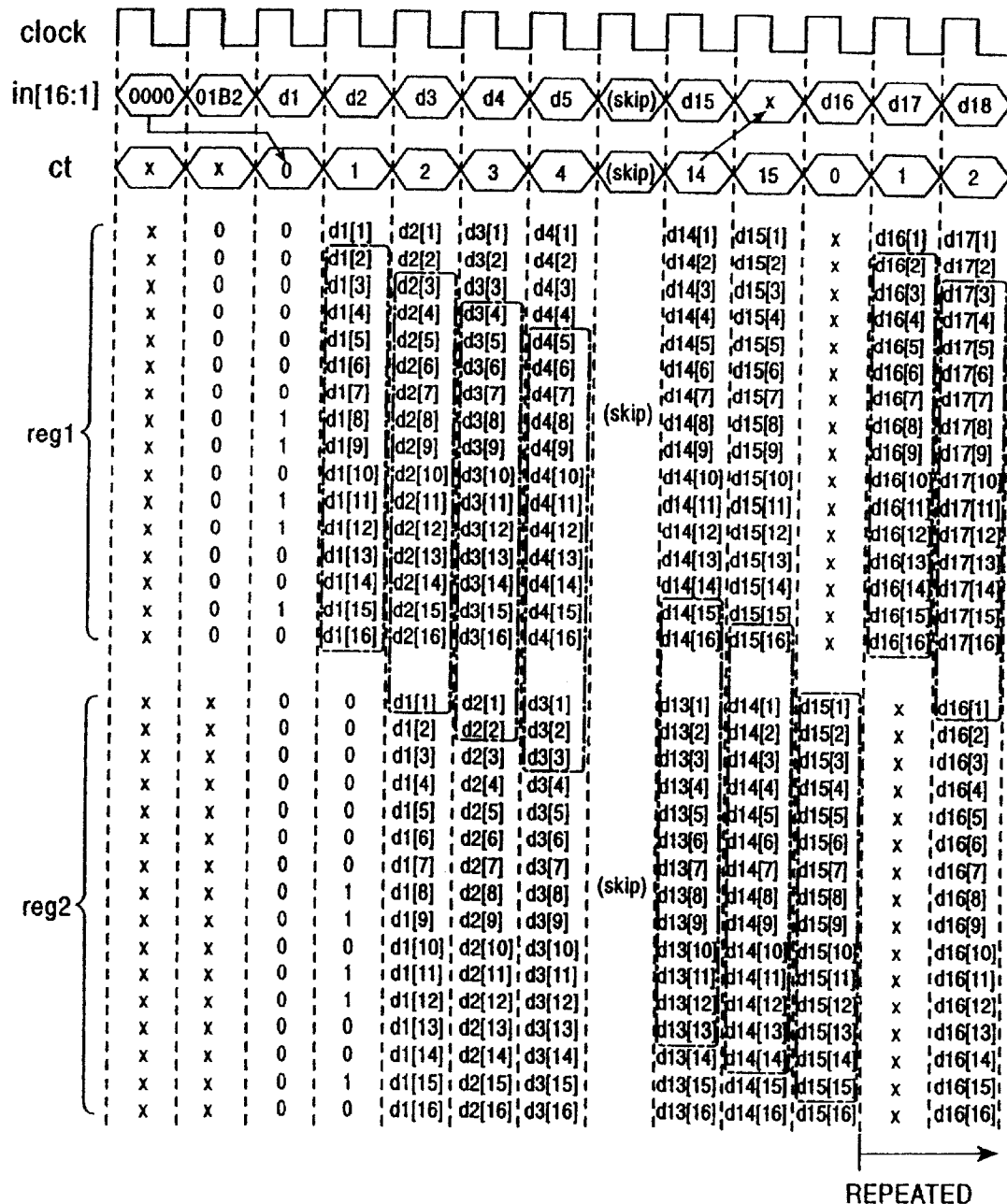
FIG. 22 is a diagram to which reference will be made in explaining start-code emulation preventing processing performed in the stream conversion sections.

FIG. 21 shows a structure of a portion that executes start-code-emulation preventing processing in the header addition section 24. FIG. 22 shows operation timing in each part. A buffer 41 stores user data to be written into the user data field, and sends user data in units of 16 bits to a register 45 in synchronization with a clock signal as shown in FIG. 22. Therefore, the buffer 41 should have a capacity larger than the value obtained by (the maximum user data length/16).

A bit-shift measurement section 42 is formed of a four-bit counter 43 which is reset in synchronization with a user data start code (0x000001B2) and an adder 44 for increasing the count by 1, and outputs a control signal ct to a data selection section 47. The register 45 stores 16-bit user data sent from the buffer 41, and outputs the stored user data reg1 to a register 46 and the data selection section 47 in synchronization with the clock. The register 46 stores 16-bit user data input from the register 45 and outputs the stored user data reg2 (which is the same user data as reg1 existing one clock cycle before) to the data selection section 47.

The data selection section 47 selects predetermined 15 bits among the user data 32 bit wide formed of the user data reg1 input from the register 45 and the user data reg2 input from the register 46, according to the value of the control signal ct sent from the bit-shift measurement section 42, and outputs them. As shown by a one-dot chain line in FIG. 22, for example, when the value of the control signal ct is three, the data selection section 47 selects 15-bit user data d3[4] to d2[2] among 32-bit user data d3[1] to d2[16]. When the value of the control signal ct is four (at the next clock cycle), the data selection section 47 selects user data d4[5] to d3[3]. A marker-bit generating section 48 outputs a marker bit of "1" after the data selection section 47 outputs 15-bit user data.

Since a marker bit is inserted at the output as described above, the output rate is lower than the input rate at the buffer 41. In other words, only 15-word input data is processed (output) in 16 clock cycles. Therefore, the buffer 41 is controlled such that it stops sending user data to the register 45 once in 16 clock cycles (when the control signal ct is 14 in the example shown in FIG. 22.

In the present embodiment, the ratio of marker bits in user data is 6.25 (=1/16) %. As compared with a case in which marker bits are inserted every 23 bits (4.35 (=1/23) %), the transmission efficiency of user data is reduced by 1.9%. Since the ratio of the user data field in the entire video signal is one-several-hundredth, however, it can be said that reduction in the transmission efficiency is sufficiently suppressed (the transmission efficiency is not reduced much) for the entire stream of a video signal.

Although preferred embodiments of the present invention and modifications thereof have been described in detail herein, it is to be understood that this invention is not limited to these embodiments and modifications, and that other modifications and variations may be effected by one skilled in the art without departing from the spirit and scope of the invention as defined by the appended claims.

What is claimed is:

1. A stream processing apparatus comprising:

parsing means for parsing a syntax of a source encoded stream to extract a plurality of coding parameters from said source encoded stream;

detecting means for detecting an error macroblock having a syntax error in said source. encoded stream in accordance with a result of a parsing process performed by said parsing means;

variable-length-decoding means for performing a variable-length-decoding process on said source encoded stream to generate a variable-length-decoded stream;

generating means for generating a predetermined macroblock having a correct syntax which conforms to a motion picture image coding experts group (MPEG) standard; and substituting means for substituting said predetermined macroblock from said generating means for said error macroblock of said variable-length-decoded stream, whereby said substituting means calculates a number of macroblocks which can not be correctly processed due to the syntax error in accordance with the number of macroblocks which have been variable-length decoded and the total number of macroblocks of a respective slice layer having said error macroblock.

2. The stream processing apparatus according to claim 1, wherein said substituting means controls said generating means so that said predetermined macroblock will be substituted for a substitution period from said error macroblock to an end macroblock of the respective slice layer having said error macroblock.

3. The stream processing apparatus according to claim 2, wherein said substituting means calculates macroblock addresses of said error macroblock, a first macroblock of said respective slice layer and a first macroblock of a subsequent slice layer, and wherein said substituting means decides said substitution period based on said macroblock addresses of said error macroblock, said first macroblock of said respective slice layer and said first macroblock of said subsequent slice layer.

4. The stream processing apparatus according claim 3, wherein said substituting means calculates a macroblock address of a respective macroblock from a slice_vertical_position indicating a vertical position of a corresponding slice layer having said respective macroblock and a macroblock_address_increment indicating a horizontal position of said respective macroblock, and wherein said slice_vertical_position and said macroblock_address_increment are extracted from said source encoded stream by said parsing process.

5. The stream processing apparatus according claim 4, wherein said slice_vertical_position is described in a header position of said corresponding slice layer of said source encoded stream and said macroblock_address_increment is described in a header position of a macroblock layer of said source encoded stream.

6. The stream processing apparatus according claim 5, wherein said parsing means extracts the macroblock_address_increment of said first macroblock of said subsequent slice layer by detecting a slice_start_code of a predetermined code.

7. The stream processing apparatus according claim 2, wherein said substituting means calculates a macroblock address of a first macroblock of said respective slice layer and a macroblock address of a first macroblock of a subsequent slice layer based on said coding parameters, and wherein said coding parameters are supplied from said parsing means and include a number of slice_vertical_positions indicating vertical positions of said slice layers and a number of macroblock_address_increments indicating horizontal positions of the macroblocks.

8. A stream processing method comprising the steps of:
   parsing a syntax of a source encoded stream to extract a plurality of coding parameters from said source encoded stream;
   detecting an error macroblock having a syntax error in said source encoded stream in accordance with a result of a parsing process;
   performing a variable-length-decoding process on said source encoded stream to generate a variable-length-decoded stream;
   generating a predetermined macroblock having a correct syntax which conforms to a motion picture image coding experts group (MPEG) standard; and
   substituting said predetermined macroblock for said error macroblock of said variable-length-decoded stream,
   whereby the step of substituting includes calculating a number of macroblocks which can not be correctly processed due to the syntax error in accordance with the number of macroblocks which have been variable-length decoded and the total number of macroblocks of a respective slice layer having said error macroblock.

9. The stream processing method according to claim 8, wherein the substituting and generating steps are controlled such that said predetermined macroblock will be substituted for a substitution period from said error macroblock to an end macroblock of the respective slice layer having said error macroblock.

10. The stream processing method according claim 9, wherein the substituting step calculates macroblock addresses of said error macroblock, a first macroblock of said respective slice layer and a first macroblock of a subsequent slice layer, and wherein the substituting step decides said substitution period based on said macroblock addresses of said error macroblock, said first macroblock of said respective slice layer and said first macroblock of said subsequent slice layer.

11. The stream processing method according claim 10, wherein the substituting step calculates a macroblock address of a respective macroblock from a slice_vertical_position indicating a vertical position of a corresponding slice layer having said respective macroblock and a macroblock_address_increment indicating a horizontal position of said respective macroblock, and wherein said slice_vertical_position and said macroblock$_{13}$ address_increment are extracted from said source encoded stream by said parsing process.

12. The stream processing method according claim 11, wherein said slice_vertical_position is described in a header position of said corresponding slice layer of said source encoded stream and said macroblock_address_increment is described in a header position of a macroblock layer of said source encoded stream.

13. The stream processing method according claim 12, wherein the parsing step extracts the macroblock_address_increment of said first macroblock of said subsequent slice layer by detecting a slice_start_code of a predetermined code.

14. The stream processing method according claim 9, wherein the substituting step calculates a macroblock address of a first macroblock of said respective slice layer and a macroblock address of a first macroblock of a subsequent slice layer based on said coding parameters, and wherein said coding parameters are supplied from the parsing step and include a number of slice_vertical_positions indicating vertical positions of said slice layers and a number of macroblock_address_increments indicating horizontal positions of the macroblocks.

15. A stream processing apparatus comprising:
   variable-length-decoding means for performing a variable-length-decoding process on a source encoded stream to generate a variable-length-decoded stream;
   detecting means for detecting, from said variable-length-decoded stream, an error macroblock having a syntax error in said source encoded stream;
   generating means for generating a predetermined macroblock having a right syntax corresponding to said variable-length-decoded stream for at least a last macroblock of consecutive macroblocks having syntax errors;
   substituting means for substituting said predetermined macroblock from said generating means for said at least last macroblock of consecutive macroblocks having syntax errors; and
   variable-length-encoding means for encoding said variable-length-decoded stream wherein said predetermined macroblock has been substituted for said at least last macroblock of consecutive macroblocks having syntax errors.

16. The stream processing apparatus according to claim 15, further comprising a stream converter provided between said variable-length-decoding means and said variable-length-encoding means for converting a format of said variable-length-decoded stream.

17. The stream processing apparatus according to draft claim 16, wherein said stream converter converts the format of the variable-length-decoded stream into a MPEG format.

18. A stream processing method comprising the steps of:

performing a variable-length-decoding process by use of a variable-length-decoding means on a source encoded stream to generate a variable-length-decoded stream;

detecting by use of a detecting means, from said variable-length-decoded stream, an error macroblock having a syntax error in said source encoded stream;

generating by use of a generating means a predetermined macroblock having a right syntax corresponding to said variable-length-decoded stream for at least a last macroblock of consecutive macroblocks having syntax errors;

substituting by use of a substituting means said predetermined macroblock from said generating means for said at least last macroblock of consecutive macroblocks having syntax errors; and encoding by use of a variable-length-encoding means said variable-length-decoded stream wherein said predetermined macroblock has been substituted for said at least last macroblock of consecutive macroblocks having syntax errors.

19. The stream processing method according to claim 18, further comprising the step of providing a stream converter between said variable-length-decoding means and said variable-length-encoding means for converting a format of said variable-length-decoded stream.

20. The stream processing method according to claim 19, wherein said stream converter converts the format of the variable-length-decoded stream into a MPEG format.

* * * * *